(12) United States Patent
Kadoyama et al.

(10) Patent No.: US 7,675,143 B2
(45) Date of Patent: Mar. 9, 2010

(54) SEMICONDUCTOR ELEMENT, SEMICONDUCTOR DEVICE AND MOUNTING BOARD

(75) Inventors: Takahide Kadoyama, Saitama (JP); Masayoshi Abe, Tokyo (JP); Atsushi Kamo, Kanagawa (JP); Takaaki Yamada, Kanagawa (JP); Chihiro Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/976,792

(22) Filed: Oct. 29, 2007

(65) Prior Publication Data

US 2008/0099886 A1    May 1, 2008

(30) Foreign Application Priority Data

Oct. 31, 2006  (JP) ............................. 2006-296532
Mar. 30, 2007  (JP) ............................. 2007-093349

(51) Int. Cl.
*H01L 23/552* (2006.01)

(52) U.S. Cl. ....................... 257/659; 257/620; 257/625; 438/456; 438/458

(58) Field of Classification Search .............. 257/620, 257/659; 438/456, 458
See application file for complete search history.

(56) References Cited

U.S. PATENT DOCUMENTS

| 7,550,850 | B2 * | 6/2009 | Nakashiba ................... 257/758 |
| 2005/0110118 | A1 | 5/2005 | Udupa et al. |
| 2007/0188998 | A1 * | 8/2007 | Noda et al. .................. 361/760 |
| 2008/0128893 | A1 * | 6/2008 | Uno ........................... 257/700 |

FOREIGN PATENT DOCUMENTS

JP    2004-179255    6/2007

* cited by examiner

*Primary Examiner*—Phuc T Dang
(74) *Attorney, Agent, or Firm*—Rader, Fishman & Grauer PLLC

(57) ABSTRACT

A semiconductor element capable of reducing noises of a circuit propagating to another circuit through a seal ring is provided. A semiconductor element includes, on a surface of a semiconductor substrate: a plurality of circuits; a ring-shaped seal ring surrounding the plurality of circuits; and wiring connecting between the seal ring and an external low-impedance node.

14 Claims, 34 Drawing Sheets

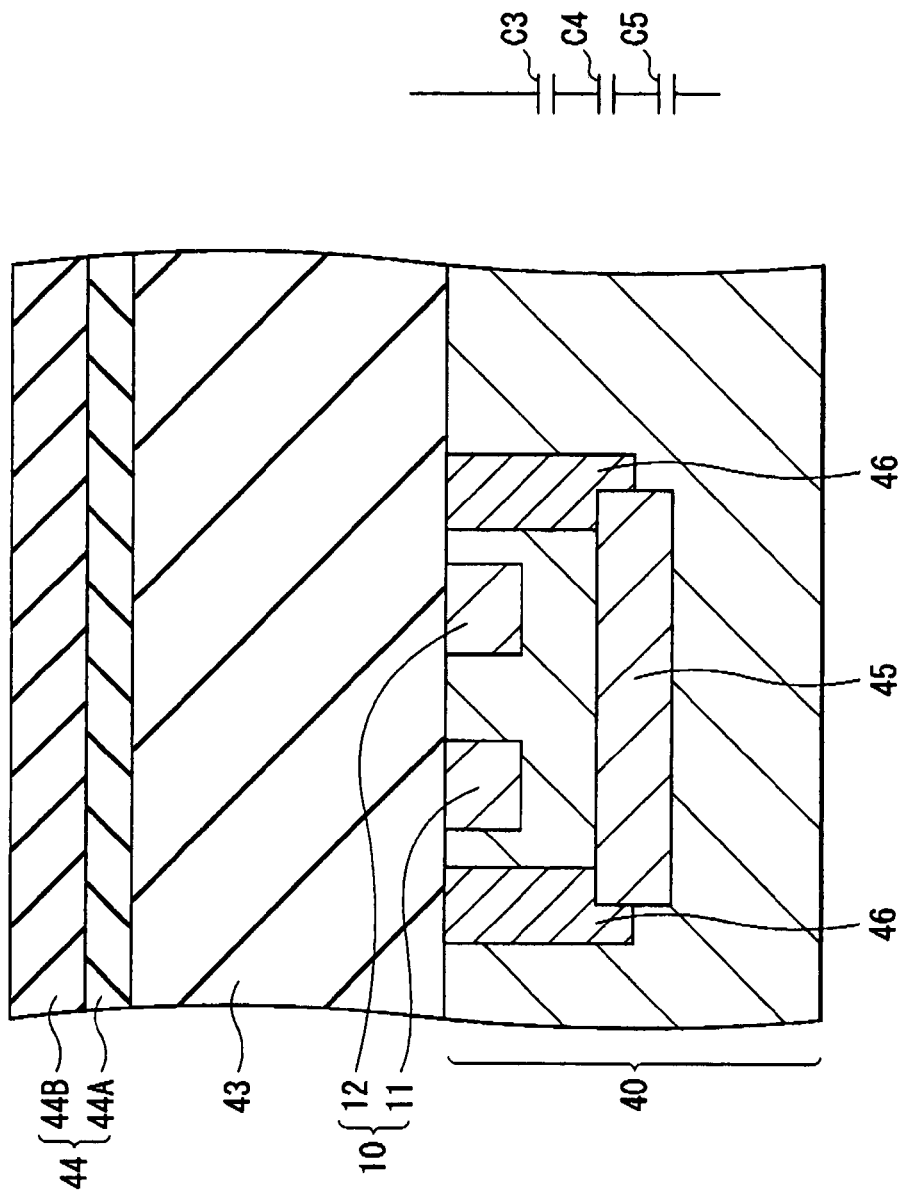

SEMICONDUCTOR ELEMENT, SEMICONDUCTOR DEVICE AND MOUNTING BOARD

CROSS REFERENCES TO RELATED APPLICATIONS

The present invention contains subject matter related to Japanese Patent Application JP 2006-296532 filed in the Japanese Patent Office on Oct. 31, 2006 and Japanese Patent Application JP 2007-093349 filed in the Japanese Patent Office on Mar. 30, 2007, the entire contents of which being incorporated herein by references.

BACKGROUND OF THE INVENTION

1. Field of the Invention

The present invention relates to a semiconductor element in which a plurality of circuits such as, for example, an analog circuit and a digital circuit are mounted on a semiconductor substrate, and a semiconductor device and a mounting board including the semiconductor element, more particularly to a semiconductor element, a semiconductor device and a mounting board which are preferably used in the case where while a digital circuit uses a large-amplitude signal, an analog circuit uses a small signal of a few μV to a few mV.

2. Description of the Related Art

With an improvement in frequency characteristics of a CMOS (Complementary Metal Oxide Semiconductor) process in recent years, an analog circuit can be formed together with a digital circuit on one chip by the CMOS process. However, in the case where the analog circuit and the digital circuit are formed on one chip, compared to the case where the analog circuit and the digital circuit are separately formed on different chips, the digital circuit is positioned closer to the analog circuit, so in particular, in the case where while the digital circuit uses a large-amplitude signal, the analog circuit uses a small signal of a few μV to a few mV, noises generated in the digital circuit may exert an influence on the analog circuit. Therefore, typically, the analog circuit is arranged as far from the digital circuit which may be a noise source as possible in a chip.

FIG. 30 shows a plan view of a typical semiconductor element 100 in which an analog circuit 110 and a digital circuit 120 are mounted on a p-type semiconductor substrate 140. In FIG. 30, an interlayer insulating film 141 and a passivation layer 142 (which will be described later) of the semiconductor element 100 are not shown. FIG. 31 shows a simplified sectional view (that is, some parts are not shown) taken along a line A-A viewed from an arrow direction, and a parasitic capacity $C_{101}$ formed between an n-type source region 111 or an n-type drain region 112 and the p-type semiconductor substrate 140. FIG. 32A shows a sectional view taken along a line B-B viewed from an arrow direction, and FIG. 32B shows a parasitic resistance $R_{101}$ formed between a via 131 and a p-type semiconductor region 133 in a sectional view of FIG. 32A.

It is obvious from FIG. 30 that the analog circuit 110 is arranged in a corner of the chip in order to be arranged away from the digital circuit 120 which may be a noise source. For example, as simply shown in FIG. 31, the analog circuit 110 is electrically connected to the p-type semiconductor substrate 140 through the n-type source region 111 or the n-type drain region 112 of a transistor included in the analog circuit 110 and the parasitic capacity $C_{101}$. Therefore, at a certain frequency or higher, the analog circuit 110 is coupled to the p-type semiconductor substrate 140 with low impedance, and the analog circuit 100 is susceptible to the potential of the p-type semiconductor substrate 140. In addition, the interlayer insulating film 141 and the passivation layer 142 formed by laminating a $SiO_2$ layer 142A and a polyimide layer 142B in this order, are laminated on the p-type semiconductor substrate 140.

As shown in FIG. 33, the potential of the p-type semiconductor substrate 140 directly below the analog circuit 110 is susceptible, because noises generated in the digital circuit 120 propagate through the p-type semiconductor substrate 140 as a path $path_1$. Therefore, in some cases, it is necessary to reduce noises (substrate noises) propagating through the path $path_1$.

Therefore, for example, as shown in FIG. 34, it can be considered that a deep n-type well layer 143 and an n-type well layer 144 which separate the analog circuit 110 from the other portion of the p-type semiconductor substrate 140 are arranged (refer to Japanese Unexamined Patent Application Publication No. 2004-179255). Thereby, as shown in FIG. 34, a parasitic capacity $C_{102}$ is formed at an interface between the deep n-type well layer 143 and the n-type well layer 144 on a side closer to the analog circuit 110, and a parasitic capacity $C_{103}$ is formed at an interface between the deep n-type well layer 143 and the n-type well layer 144 on a side opposite to the side closer to the analog circuit 110, and the analog circuit 110 is electrically connected to the p-type semiconductor substrate 140 through the parasitic capacities $C_{101}$, $C_{102}$ and $C_{103}$ which are connected in series, so, compared to the case where the deep n-type well layer 143 and the n-type well layer 144 are not arranged, the impedance in a low-frequency region between the analog circuit 110 and the p-type semiconductor substrate 140 can be increased. In a high-frequency, the impedance can be relatively high. As a result, the analog circuit 110 can be less susceptible to the potential of the p-type semiconductor substrate 140.

SUMMARY OF THE INVENTION

In a semiconductor element 100 shown in FIG. 30, a seal ring 130 is arranged to prevent a decline in reliability of an analog circuit 110 and a digital circuit 120 caused by the entry of water or ions into the circuits, and to prevent chipping occurring during a dicing process in which a wafer is divided along a scribe line region from reaching inside a chip. As shown in FIGS. 30 and 32A, the seal ring 130 is arranged in a portion surrounding the analog circuit 110 and the digital circuit 120 of a surface of the p-type semiconductor substrate 140, and the seal ring 130 is formed by alternately laminating vias 131 and wiring layers 132 on a high-concentration p-type semiconductor region 133 formed on the surface of the p-type semiconductor substrate 140. The side of the seal ring 130 is covered with an interlayer insulating film 141 formed on the p-type semiconductor substrate 140, the top surfaces of the seal ring 130 and the interlayer insulating film 141 are covered with a passivation layer 142. Moreover, an element separation insulating film 149 is arranged between the seal ring 130 and an element constituting the analog circuit 110 and the digital circuit 120 on the surface of the p-type semiconductor substrate 140.

As shown in FIG. 32B, the seal ring 130 is electrically connected to the p-type semiconductor substrate 140 directly below the seal ring 130 through a resistance $R_{101}$. Therefore, noises generated in the digital circuit 120 propagate through not only the path $path_1$ but also the seal ring 130 as paths $path_2$ and $path_3$. Moreover, the impedance of the seal ring 130 is lower than that of the p-type semiconductor substrate 140, so it is more important to reduce noises (substrate noises) propagating through the paths $path_2$ and $path_3$ than through the path $path_1$.

Therefore, it can be considered that, as shown in FIG. 35, an n-type semiconductor region 134 is arranged on the surface of the p-type semiconductor substrate 140 instead of the p-type semiconductor region 133, and as shown in FIG. 35, a parasitic capacity $C_{104}$ is formed between the seal ring 130 and the p-type semiconductor substrate 140. However, even in this case, a high-frequency signal is not attenuated by the parasitic capacity $C_{104}$, and passes through. Moreover, it can be considered that, as shown in FIG. 36, an inner seal ring 410 is arranged on an edge portion of a semiconductor element 400 including an analog circuit and a digital circuit (both not shown), and an outer seal ring 420 is arranged outside the inner seal ring 410. In this case, as shown in FIG. 37, the inner seal ring 410 includes a p-type impurity diffused region 412 and an n-type impurity diffused region 413 on a surface layer of a p-type semiconductor substrate 411. On a surface including the p-type impurity diffused region 412 and the n-type impurity diffused region 413, a plurality of oxidized layers 414 are laminated at predetermined intervals, and vias 415 are formed in regions facing the p-type impurity diffused region 412 and the n-type impurity diffused region 413 of each oxidized layer 414, and the via 415 at the bottom is in contact with the p-type impurity diffused region 412 and the n-type impurity diffused region 413. Further, between the vias 415, a metal layer 416 in contact with the vias 415 above and below the metal layer 416 is formed. On the other hand, as shown in FIG. 38, the outer seal ring 420 is formed by alternately laminating oxidized layer 421 and metal layers 422, and vias 423 are formed in a predetermined region of each oxidized laeyr 421. Each via 423 except the via 423 at the bottom is in contact with the metal layers 422 above and below the via 423, and the via 423 at the bottom is in contact with the metal layer 422 at the bottom and the p-type semiconductor substrate 411 (refer to US Patent Application Publication No. 2005/0110118).

However, in the technique of US Patent Application Publication No. 2005/0110118, the inner seal ring 410 is in ohmic contact with the p-type semiconductor substrate 411, and becomes a noise propagation path, so irrespective of whether the outer seal ring 420 is arranged or not, the analog circuit in the semiconductor element 400 is affected by the potential of the p-type semiconductor substrate 411.

In view of the foregoing, it is desirable to provide a semiconductor element capable of reducing noises of a circuit propagating to the other circuit through a seal ring, and a semiconductor device and a mounting board including the semiconductor element.

According to an embodiment of the invention, there is provided a first semiconductor element in which a plurality of circuits are mounted on a surface of a semiconductor substrate. The first semiconductor element includes a ring-shaped seal ring surrounding the plurality of circuits and wiring connecting between the seal ring and an external low-impedance node.

In the first semiconductor element according to the embodiment of the invention, the wiring is arranged electrically connecting between the seal ring and the external low-impedance node. Thereby, a signal propagating in the seal ring flows into the external low-impedance node through the wiring.

According to an embodiment of the invention, there is provided a second semiconductor element in which a plurality of circuits are mounted on a surface of a semiconductor substrate. The second semiconductor element includes a ring-shaped seal ring surrounding the plurality of circuits; a capacity element of which one end is connected to an external low-impedance node; and wiring connecting between the seal ring and the other end of the capacity element.

In the second semiconductor element according to the embodiment of the invention, the wiring is arranged electrically connecting between the seal ring and the capacity element, and the capacity element is connected to the external low-impedance node. Thereby, a signal propagating in the seal ring flows into the capacity element through the wiring and then flows into the external low-impedance node through the capacity element.

According to an embodiment of the invention, there is provided a third semiconductor element in which a plurality of circuits are mounted on a surface of a first conductivity type semiconductor substrate. The third semiconductor element includes a ring-shaped seal ring surrounding the plurality of circuits and a second conductivity type well layer separating a portion facing the seal ring of the semiconductor substrate from the other portion of the semiconductor substrate.

In the third semiconductor element according to the embodiment of the invention, the second conductivity type well layer is arranged separating a portion facing the seal ring of the semiconductor substrate from the other portion of the semiconductor substrate. Thereby, parasitic capacities are formed at an interface of the well layer on a seal ring side and an interface of the well layer on a side opposite to the seal ring side, and the seal ring is electrically connected to the semiconductor substrate through the parasitic capacities which are connected in series.

According to an embodiment of the invention, there is provided a fourth semiconductor element in which a plurality of circuits are mounted on a surface of the semiconductor substrate. The fourth semiconductor element includes a ring-shaped seal ring surrounding the plurality of circuits, and the seal ring has a shape meandering in a direction orthogonal to an extending direction.

In the fourth semiconductor element according to the embodiment of the invention, the seal ring has a shape meandering in a direction orthogonal to an extending direction. The meandering shape functions as resistance for a high-frequency signal propagating in the seal ring.

According to an embodiment of the invention, there is provided a fifth semiconductor element in which a plurality of circuits are mounted on a surface of a first conductivity type semiconductor substrate. The fifth semiconductor element includes a ring-shaped seal ring surrounding the plurality of circuits, and an insulating layer is formed between the semiconductor substrate and the seal ring.

In the fifth semiconductor element according to the embodiment of the invention, the insulating layer is formed between the semiconductor substrate and the seal ring. Thereby, the seal ring is electrically separated from the semiconductor substrate by the insulating layer.

According to an embodiment of the invention, there is provided a semiconductor device including at least one of the first to the fifth semiconductor elements. The semiconductor device includes a supporting body; the semiconductor element being formed on one surface of the supporting body; a lid being placed over the semiconductor element; and one or a plurality of terminals penetrating through the supporting body and being connected to the semiconductor element.

According to an embodiment of the invention, there is provided a mounting board including a supporting substrate and the above-described semiconductor device being mounted on the supporting substrate.

In the first semiconductor element according to the embodiment of the invention, and the semiconductor device and the mounting board including the first semiconductor element, the wiring electrically connecting between the seal ring and the external low-impedance node is formed, so noises generated in one circuit (for example, a digital circuit) can be emitted to the external low-impedance node through the wiring. Thereby, the noises of one circuit propagating to another circuit (for example, an analog circuit) through the seal ring can be reduced.

In the second semiconductor element according to the embodiment of the invention, and the semiconductor device and the mounting board including the second semiconductor element, the wiring electrically connecting between the seal ring and the capacity element is formed, and the capacity element is connected to the external low-impedance node, so noises generated in one circuit can be emitted to the external low-impedance node through the wiring and the capacity element. Thereby, the noises of one circuit propagating to another circuit through the seal ring can be reduced.

In the third semiconductor element according to the embodiment of the invention, and the semiconductor device and the mounting board including the third semiconductor element, the second conductivity-type well layer separating a portion facing the seal ring of the first conductivity-type semiconductor substrate from the other portion of the semiconductor substrate is formed, so, compared to the case where such a well layer is not arranged, the impedance in a low-frequency region between one circuit and the semiconductor substrate can be increased. In a high-frequency, the impedance can be relatively high. Thereby, the noises of one circuit propagating to another circuit through the seal ring can be reduced.

In the fourth semiconductor element according to the embodiment of the invention, and the semiconductor device and the mounting board including the fourth semiconductor element, the seal ring has a shape meandering in a direction orthogonal to an extending direction, so, compared to the case where the seal ring does not have a meandering shape, the impedance in a low-frequency region between one circuit and the semiconductor substrate can be increased. In a high-frequency, the impedance can be relatively high. Thereby, the noises of one circuit-propagating to another circuit through the seal ring can be reduced.

In the fifth semiconductor element according to the embodiment of the invention, and the semiconductor device and the mounting board including the fifth semiconductor element, the insulating layer is formed between the semiconductor substrate and the seal ring, so, compared to the case where such an insulating layer is not arranged, the impedance between one circuit and the semiconductor substrate can be increased. Thereby, the noises of one circuit propagating to another circuit through the seal ring can be reduced.

Other and further objects, features and advantages of the invention will appear more fully from the following description.

BRIEF DESCRIPTION OF THE DRAWINGS

FIGS. 20A and 20B are sectional views of a semiconductor element according to another modification of each embodiment;

DETAILED DESCRIPTION OF THE PREFERRED EMBODIMENTS

Preferred embodiments will be described in detail below referring to the accompanying drawings.

First Embodiment

Figure 1:
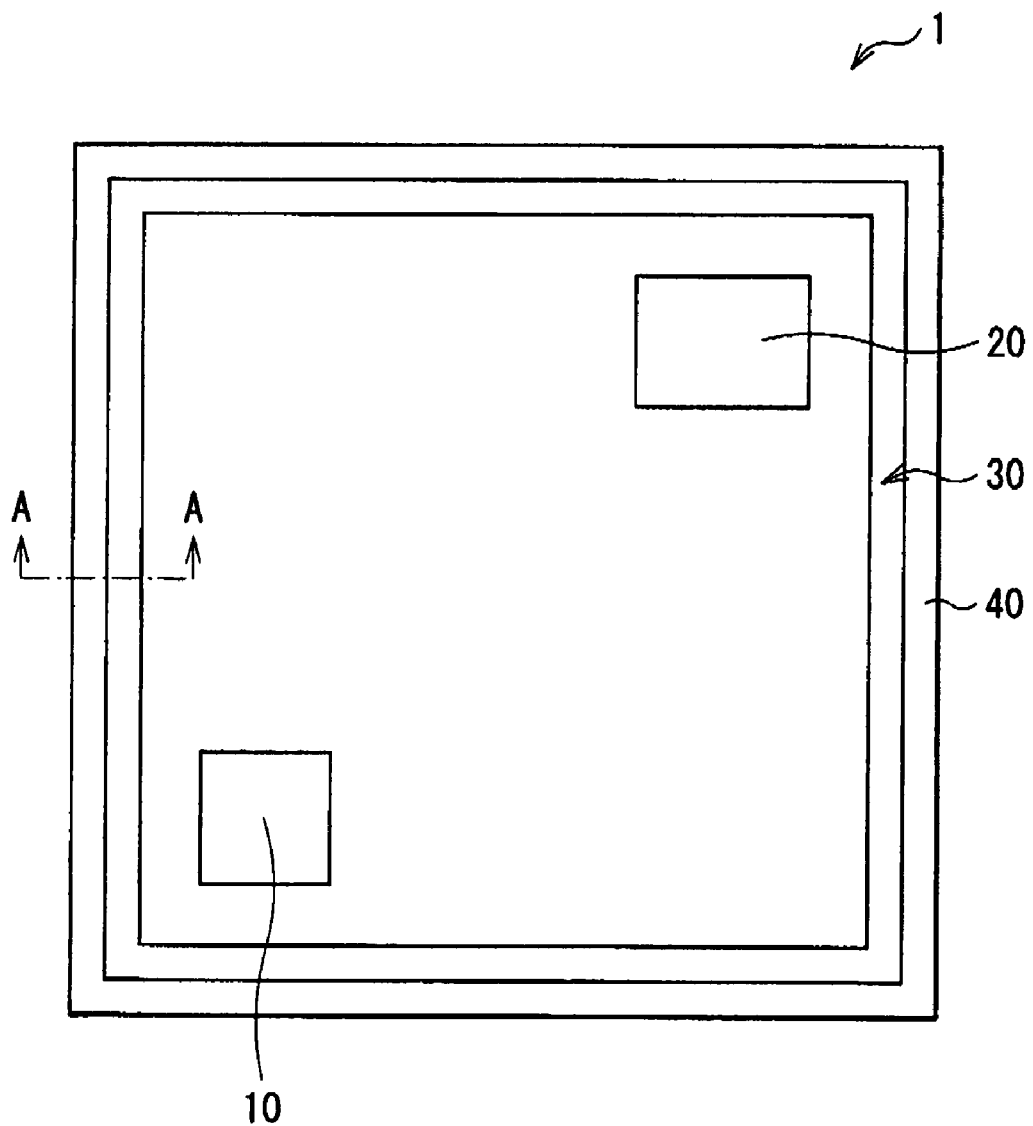
FIG. 1 is a plan view of a semiconductor element (an interlayer insulating film and a passivation layer are not shown) according to a first embodiment of the invention.
Figure 2:
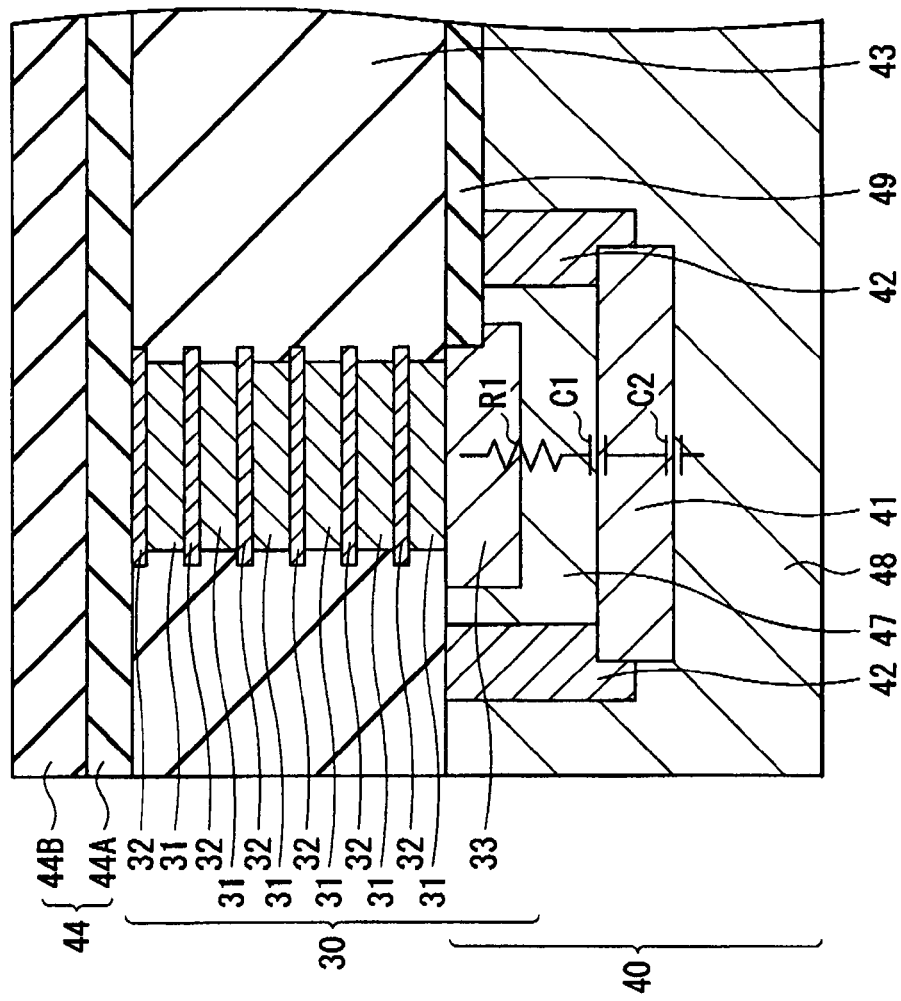
FIG. 2 is a sectional view taken along a line A-A of FIG. 1 viewed from an arrow direction.

FIG. 1 shows a plan view of a semiconductor element 1 according to a first embodiment of the invention. In FIG. 1, an interlayer insulating film 43 and a passivation layer 44 (which will be described later) of the semiconductor element 1 are not shown. FIG. 2 shows a sectional view taken along a line A-A of FIG. 1 viewed from an arrow direction, and a state in which a resistance $R_1$ formed between a via 31 and a p-type semiconductor region 33 in a sectional portion, a parasitic capacity $C_1$ formed between a p-type semiconductor region 47 directly below the p-type semiconductor region 33 and a deep n-type well layer 41, and a parasitic capacity $C_2$ formed between a p-type semiconductor region 48 directly below the deep n-type well layer 41 and the deep n-type well layer 41 are connected in series. The deep n-type well layer 41 is biased by a positive DC voltage to reduce $C_1$ and $C_2$ and obtain the isolation between a seal ring 30 and a p-type semiconductor substrate 40.

As shown in FIG. 1, the semiconductor element 1 includes an analog circuit 10 and a digital circuit 20 implemented on a p-type semiconductor substrate 40. Although it is not shown, for example, the analog circuit 10 is electrically connected to the p-type semiconductor substrate 40 through a parasitic capacity formed between an n-type source region or an n-type drain region of a transistor included in the analog circuit 10 and the p-type semiconductor substrate 40. Therefore, at a certain frequency or higher, the analog circuit 10 is coupled to the p-type semiconductor substrate 40 with low impedance, and the analog circuit 10 is susceptible to the potential of the p-type semiconductor substrate 40. Therefore, it is preferable that the analog circuit 10 is arranged away from the digital circuit 20 which may be a noise source, and is arranged in a corner of a chip, as shown in FIG. 1.

Moreover, in the semiconductor element 1, as shown in FIGS. 1 and 2, a seal ring 30 is arranged. The seal ring 30 is formed on a surface of an edge portion (a scribe line region in a wafer before cutting the semiconductor element 1 into a chip) of the p-type semiconductor substrate 40 and has a ring shape surrounding the analog circuit 10 and the digital circuit 20 on the surface of the p-type semiconductor substrate 40. Further, the seal ring 30 has a laminate configuration in which vias 31 and wiring layers 32 are alternately laminated on a high-concentration p-type semiconductor region 33 formed on the surface of the p-type semiconductor substrate 40. Thereby, the seal ring 30 prevents a decline in reliability of the analog circuit 10 and the digital circuit 20 caused by the entry of water, ions or the like into the circuits. Moreover, the seal ring 30 prevents chipping from occurring during a dicing process in which a wafer is separated along the scribe line region from reaching inside a chip.

The side of the seal ring 30 is covered with the interlayer insulating film 43 formed on the p-type semiconductor substrate 40, the top surfaces of the seal ring 30 and the interlayer insulating film 43 are covered with the passivation layer 44 formed by laminating a $SiO_2$ layer 44A and a polyimide layer 44B in this order.

Moreover, an element separation insulating film 49 is arranged between the seal ring 30 and an element constituting the analog circuit 10 and the digital circuit 20 on the surface of the p-type semiconductor substrate 40. The element separation insulating film 49, formed of, for example, LOCOS (local oxidation of silicon) or STI (Shallow Trench Isolation), separates the seal ring 30 and the element constituting the analog circuit 10 and the digital circuit 20 from each other on the surface of the p-type semiconductor substrate 40.

Further, in the semiconductor element 1, as shown in FIG. 2, the deep n-type well layer 41 and the n-type well layer 42 are arranged. The deep n-type well layer 41 is arranged so as to face the bottom surface of the seal ring 30 and has a ring shape. The n-type well layer 42 is arranged so as to come into contact with the seal ring 30 on an inner periphery and an outer periphery of the seal ring 30 and to be exposed to the surface of the p-type semiconductor substrate 40 and has a ring shape. In other words, the bottom surface (the p-type semiconductor region 33) of the seal ring 30 is separated from the other portion of the p-type semiconductor substrate 40 by the deep n-type well layer 41 and the n-type well layer 42. Thereby, as shown in FIG. 2, the resistance $R_1$ is formed between the via 31 and the p-type semiconductor region 33 and 47, the parasitic capacity $C_1$ is formed between the deep n-type well layer 41 and the p-type semiconductor region 47, the parasitic capacity $C_2$ is formed between the deep n-type well layer 41 and the p-type semiconductor region 48, and they are connected in series, so the seal ring 30 is electrically connected to the p-type semiconductor substrate 40 through the resistance $R_1$, the parasitic capacity $C_1$ and the parasitic capacity $C_2$ which are connected in series.

In the semiconductor element 1 according to the embodiment, when the analog circuit 10 and the digital circuit 20 are driven, various noises are generated from them. At this time, for example, in the case where, while a high-frequency signal with a large amplitude flows in the digital circuit 20, a high-frequency signal with a small amplitude of a few μV to a few mV flows in the analog circuit 10, the possibility that noises generated in the digital circuit 20 exert an influence on the analog circuit 10 is increased.

Figure 3:
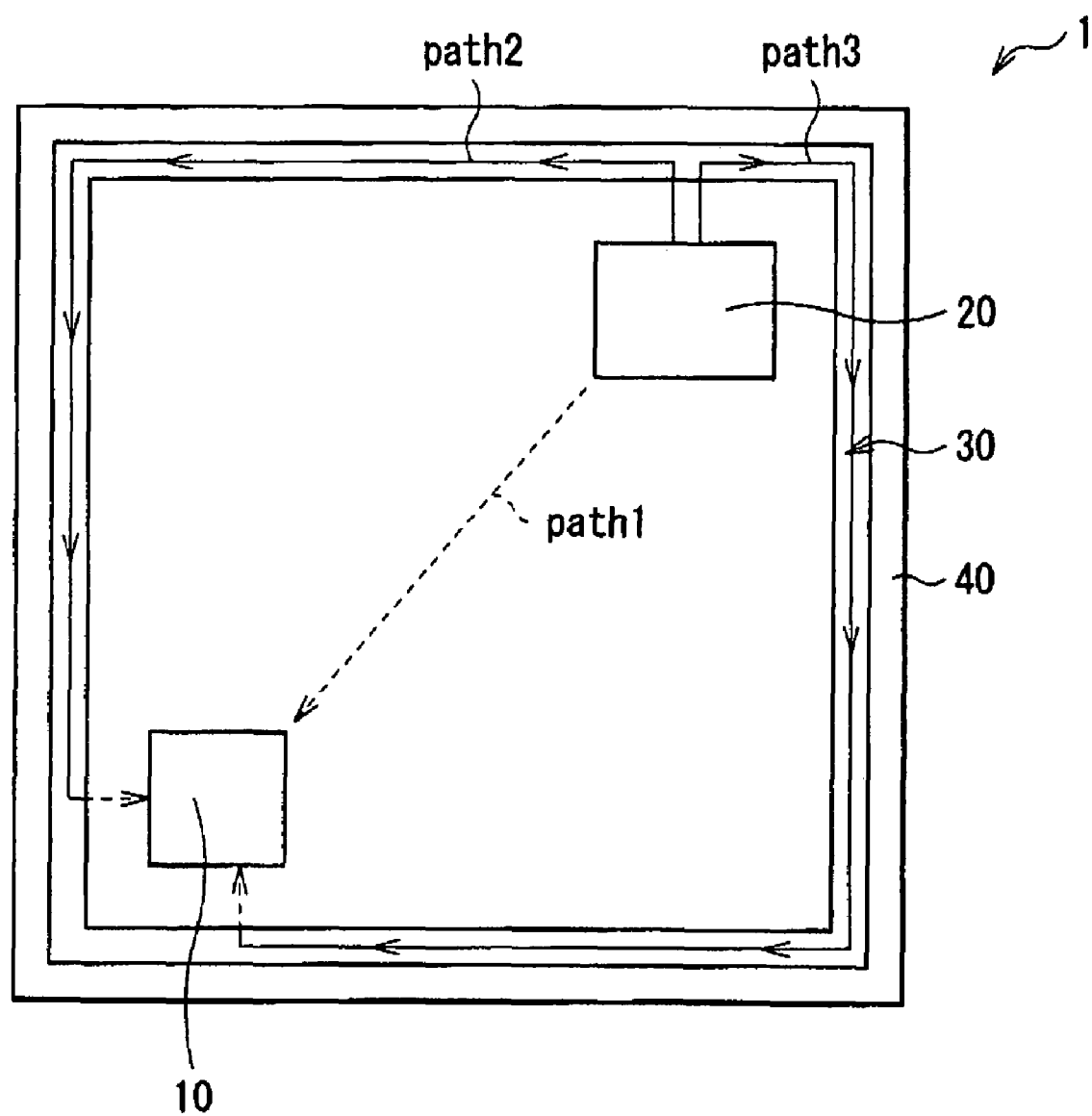
FIG. 3 is a plan view for describing noise propagation paths in the semiconductor element shown in FIG. 1.
Figure 30:
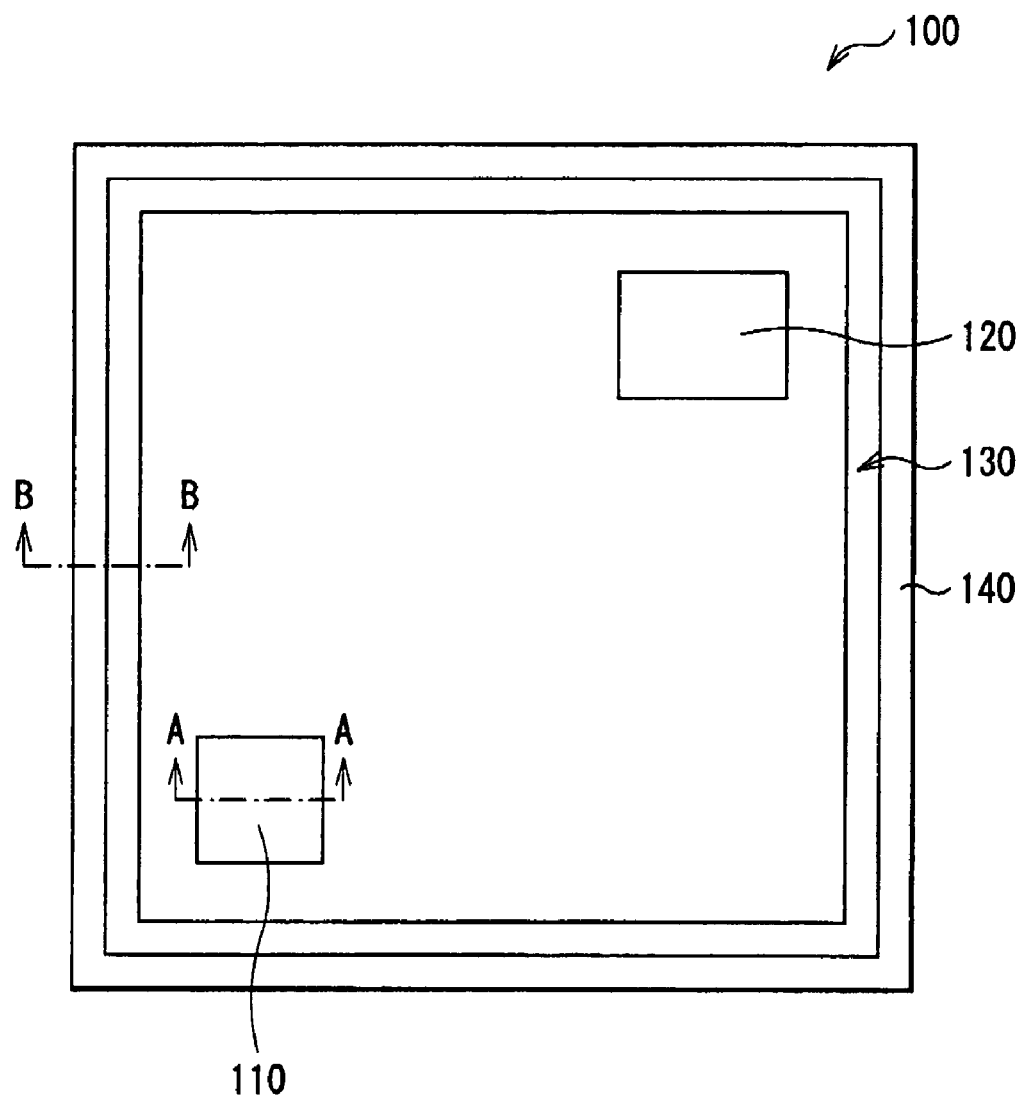
FIG. 30 is a plan view of a semiconductor element (an interlayer insulating film and a passivation layer are not shown) in a related art.
Figure 31:
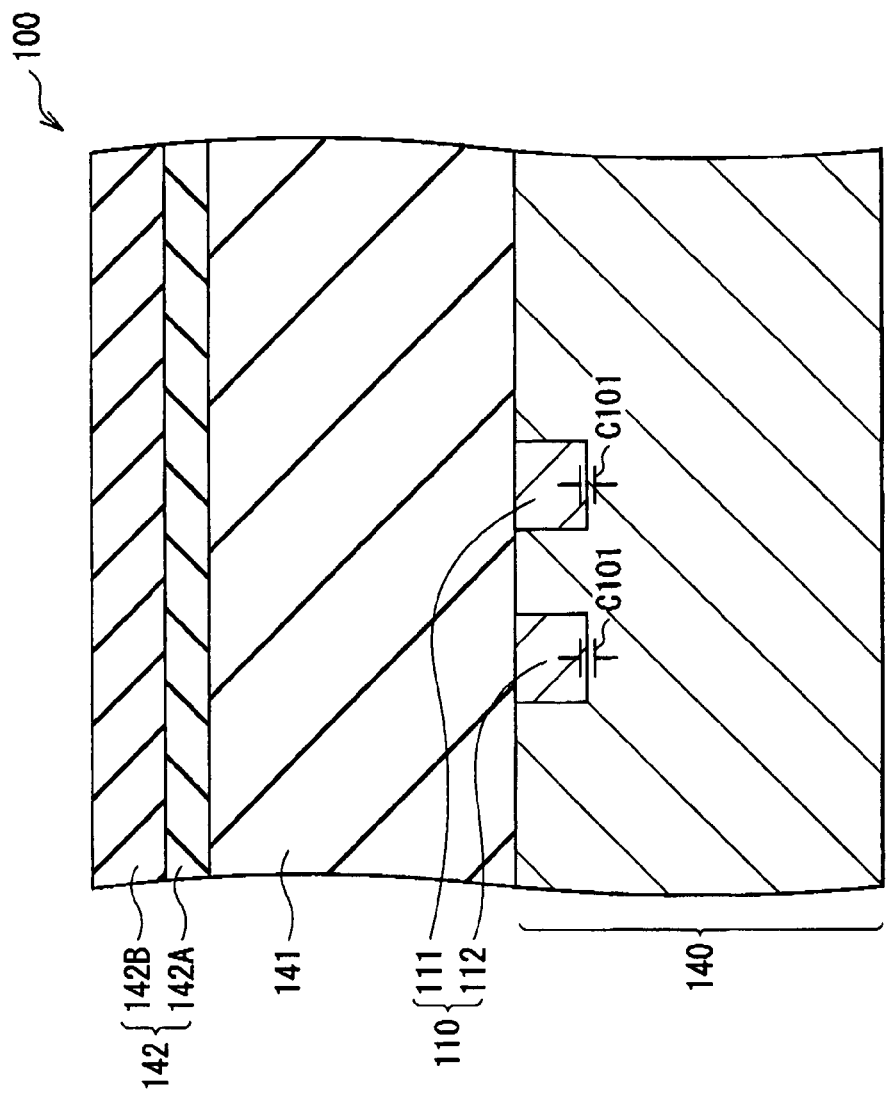
FIG. 31 is a sectional view taken along a line A-A of FIG. 30 viewed from an arrow direction.
Figures 32A, 32B:
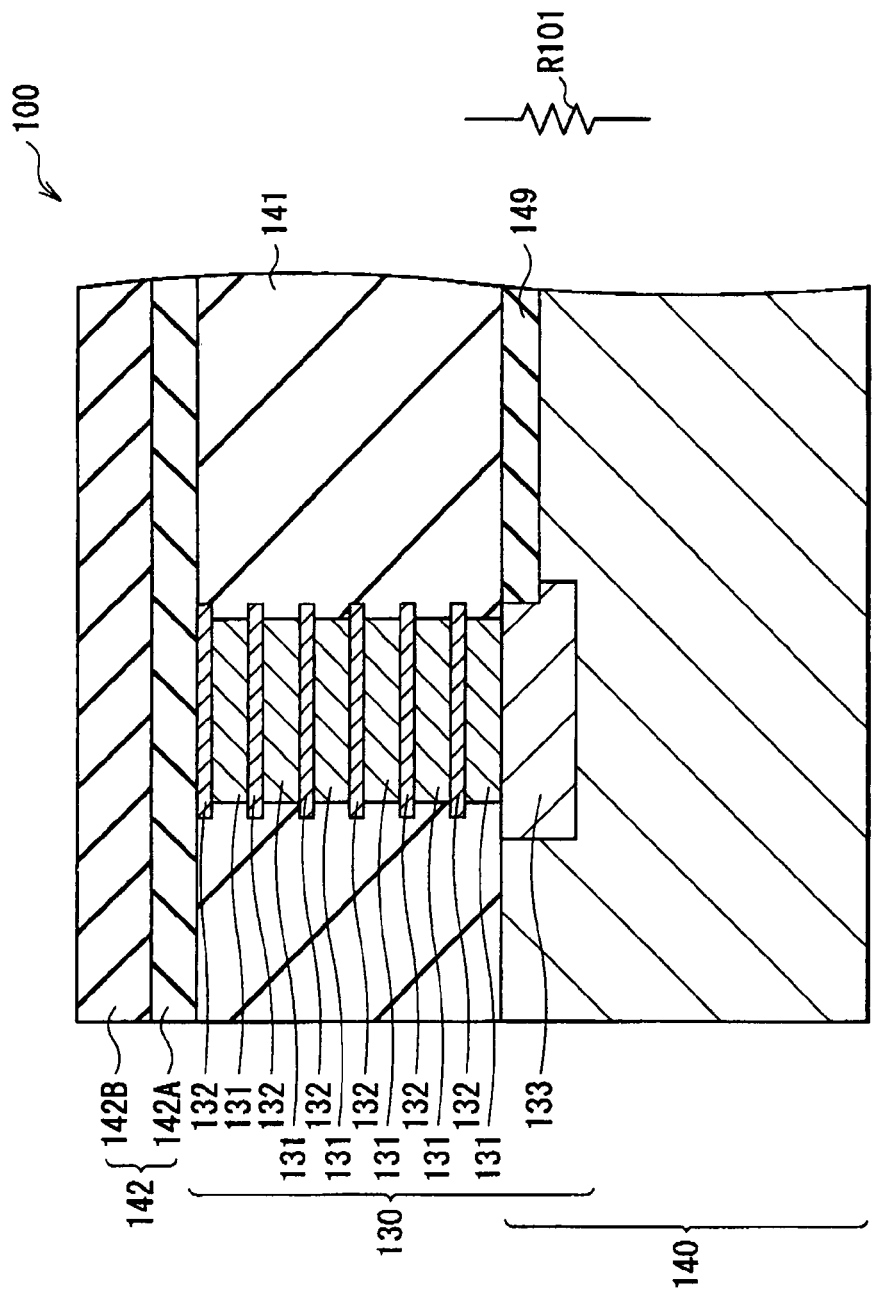
FIGS. 32A and 32B are sectional views taken along a line B-B of FIG. 30 viewed from an arrow direction.
Figure 33:
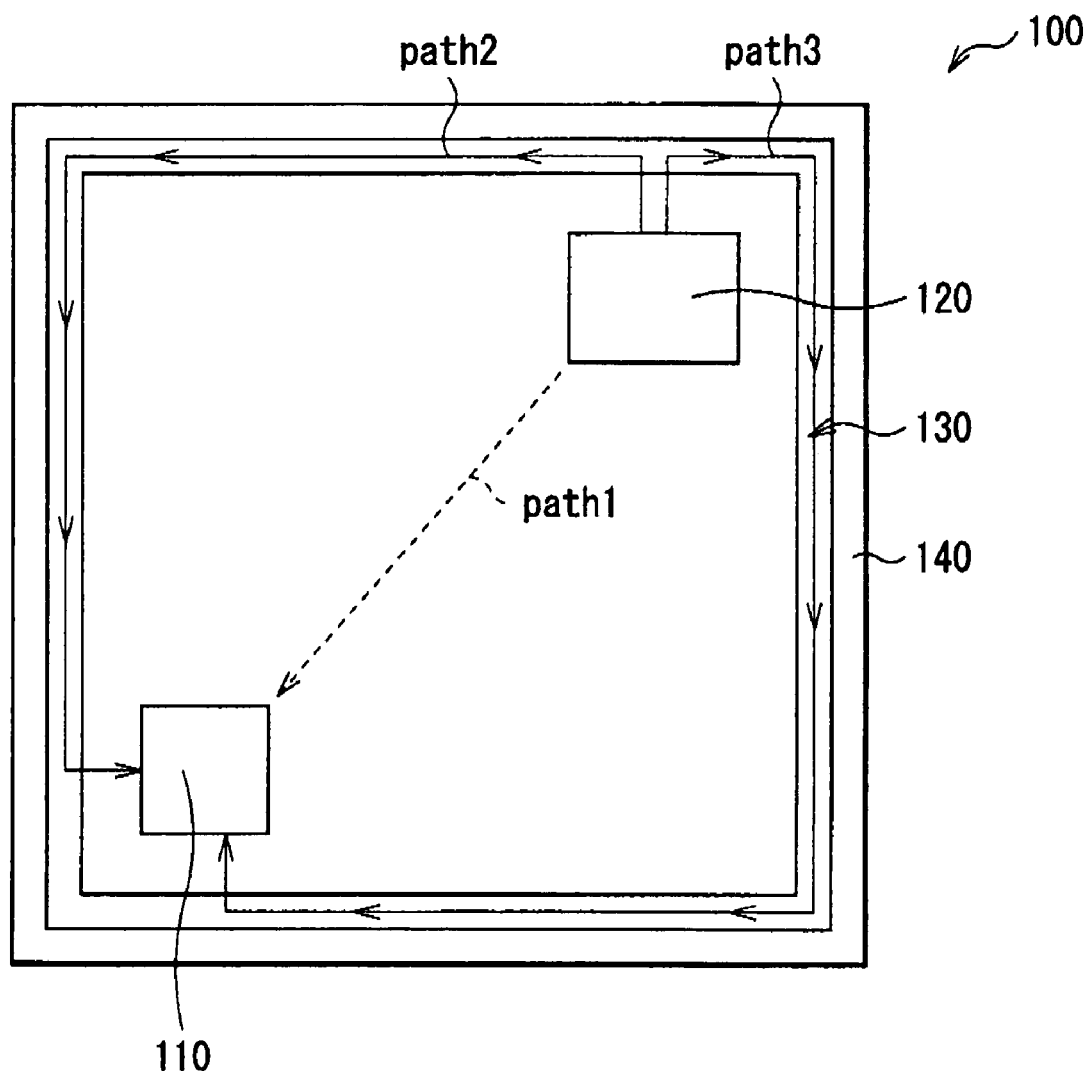
FIG. 33 is a plan view for describing noise propagation paths in the semiconductor element shown in FIG. 30.

As shown in FIG. 3, the noises generated in the digital circuit 20 propagate to the analog circuit 10 through the p-type semiconductor substrate 40 as a path $path_1$, and propagate to the analog circuit 10 through the seal ring 30 as paths $path_2$ and $path_3$. However, typically the impedance of the seal ring 30 is lower than that of the p-type semiconductor substrate 40. Therefore, as shown in FIG. 30, in a semiconductor element 100 in a related art, noises generated in a digital circuit 120 propagate to an analog circuit 110 through paths $path_2$ and $path_3$.

On the other hand, in the semiconductor element 1 according to the embodiment, the deep n-type well layer 41 and the n-type well layer 42 are formed so as to separate the bottom surface (the p-type semiconductor region 33) of the seal ring 30 from the other portion of the p-type semiconductor substrate 40, and the seal ring 30 is electrically connected to the p-type semiconductor substrate 40 through the resistance $R_1$, the parasitic capacity $C_1$ and the parasitic capacity $C_2$ which are connected in series, so, compared to the semiconductor element 100 in the related art in which the deep n-type well layer 41 and the n-type well layer 42 are not arranged, the impedance in a low-frequency region between the seal ring 30 and the p-type semiconductor substrate 40 is higher. In a high-frequency, the impedance can be relatively high. Thereby, even if noises generated in the digital circuit 20 propagate through the paths $path_2$ and $path_3$, noises are attenuated by a high impedance between the seal ring 30 and the p-type semiconductor substrate 40, so the influence of noises generated in the digital circuit 20 exerted on the potential of the p-type semiconductor substrate 40 directly below the analog circuit 10 can be reduced. As a result, the noises of the digital circuit 20, propagating to the analog circuit 10 through the seal ring 30, can be reduced.

Moreover, in the embodiment, noises propagating through the paths $path_2$ and $path_3$ are attenuated by the deep n-type well layer 41 and the n-type well layer 42 before the noises propagate in the p-type semiconductor substrate 40, so noises largely attenuated by a portion with a high impedance (the deep n-type well layer 41 and the n-type well layer 42) can be further attenuated until the noises reach the analog circuit 10. Therefore, in the embodiment, compared to the case where like a semiconductor element in a related art, a deep n-type well layer 143 and an n-type well layer 144 are arranged directly below an analog circuit 110, and noises propagating in a p-type semiconductor substrate 140 is attenuated in close vicinity to the analog circuit 110 (refer to FIGS. 23 and 27), noises of the digital circuit 20 propagating to the analog circuit 10 through the seal ring 30 can be further reduced.

Modification of First Embodiment

In the above-described embodiment, the p-type semiconductor region 33 of a conductivity type equal to that of the p-type semiconductor substrate 40 is formed in the bottom of the seal ring 30. However, an n-type semiconductor region (not shown) may be formed in the bottom of the seal ring 30. Thereby, a parasitic capacity is formed between the n-type semiconductor region and the p-type semiconductor region 47, and is connected to the other parasitic capacities $C_1$ and $C_2$ in series, so a frequency band with high impedance between the seal ring 30 and the p-type semiconductor substrate 40 can be further expanded on a high frequency side than the case of the above-described embodiment. As a result, even in the case where a frequency band used in the analog circuit 10 is extremely high, the impedance between the seal ring 30 and the p-type semiconductor substrate 40 in the used frequency band can be increased, so high-frequency noises of the digital circuit 20 propagating to the analog circuit 10 through the seal ring 30 can be reduced.

Second Embodiment

Figure 4:
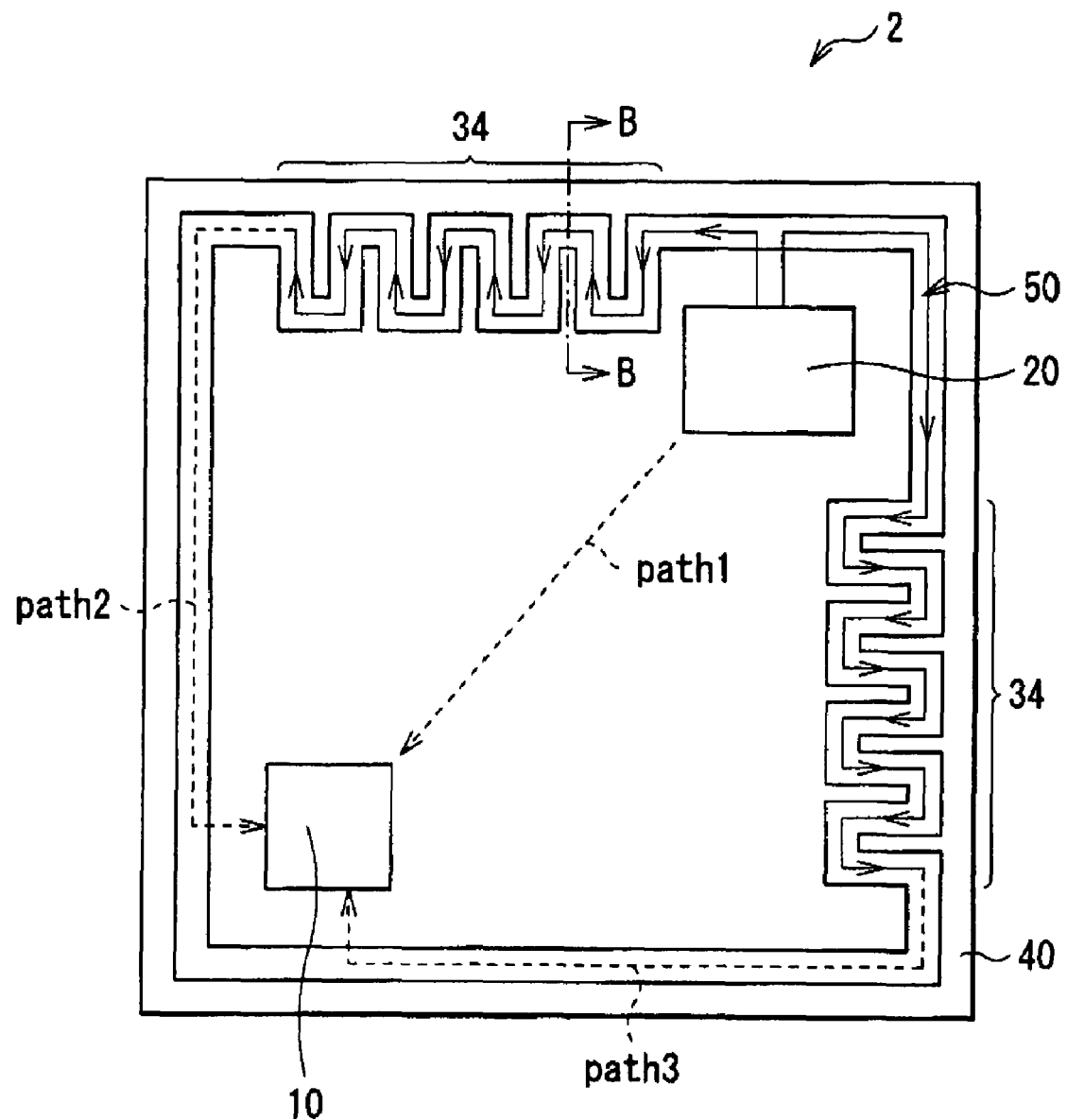
FIG. 4 is a plan view of a semiconductor element (an interlayer insulating film and a passivation layer are not shown) according to a second embodiment of the invention.
Figures 5A, 5B:
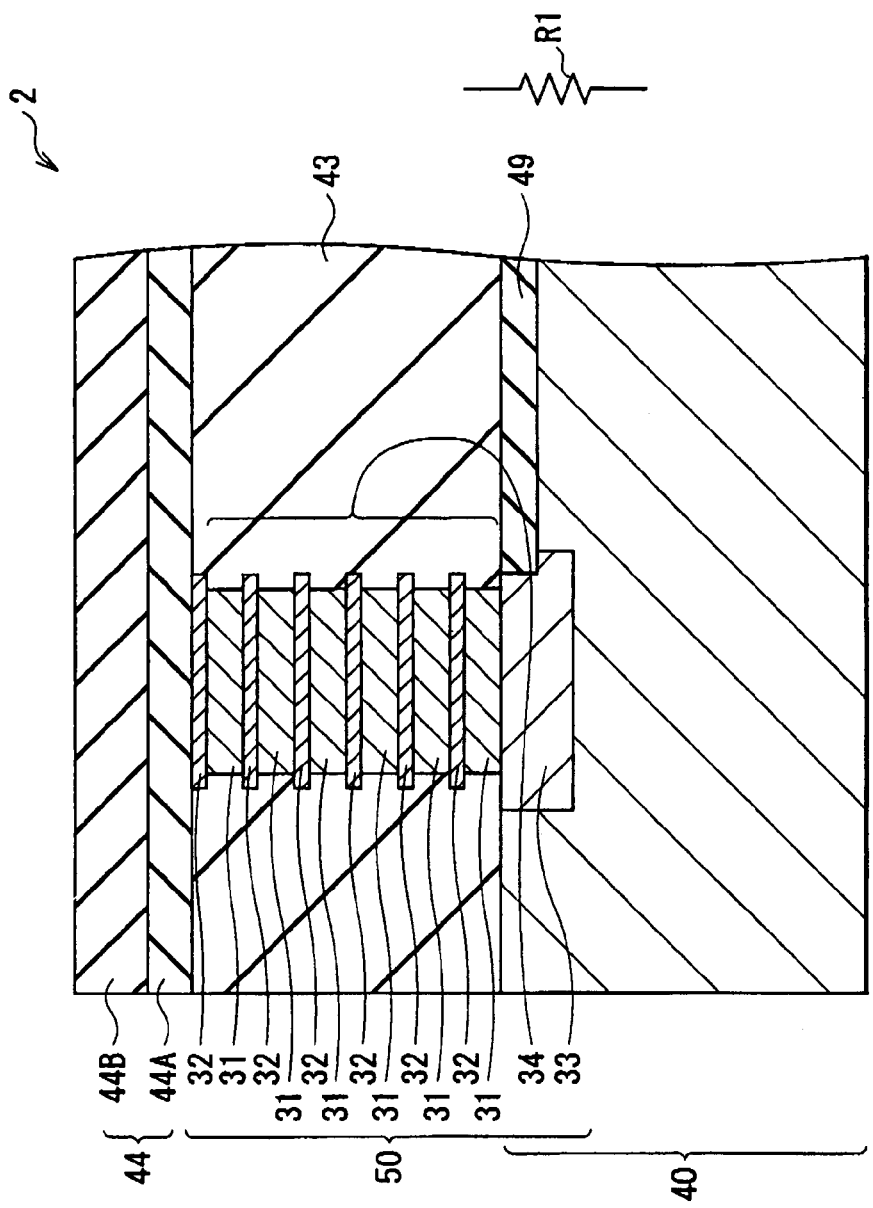
FIGS. 5A and 5B are sectional views taken along a line B-B of FIG. 4 viewed from an arrow direction.

FIG. 4 shows a plan view of a semiconductor element 2 according to a second embodiment of the invention. In FIG. 4, the interlayer insulating film 43 and the passivation layer 44 of the semiconductor element 2 are not shown. FIG. 5A shows a sectional view taken along a line B-B of FIG. 4 viewed from an arrow direction, and FIG. 5B shows the resistance $R_1$ formed between the via 31 and the p-type semiconductor region 33 in a sectional portion of FIG. 5A.

The configuration of the semiconductor element 2 is distinguished from that in the above-described embodiment by the fact that the semiconductor element 2 includes a seal ring 50 formed by adding a meander section 34 to the components of the seal ring 30 in the above-described embodiment, and the deep n-type well layer 41 and the n-type well layer 42 in the above-described embodiment are not included. Therefore, configurations, functions and effects similar to those in the above-described embodiment will not be further described, and mainly differences from the above-described embodiment will be described below.

As shown in FIG. 4, the meander section 34 has a shape meandering in a direction orthogonal to an extending direction and functions as a high impedance path to high-frequency noises propagating in the seal ring 50. In other words, in the embodiment, to increase the impedance of the paths $path_2$ and $path_3$, the meander section 34 is used instead of the deep n-type well layer 41 and the n-type well layer 42 in the above-described embodiment. Thereby, even if noises generated in the digital circuit 20 propagate through the paths $path_2$ and $path_3$, the noises are attenuated by high impedance of the meander section 34, so the influence of the noises generated in the digital circuit 20 exerted on the potential of the p-type semiconductor substrate 40 directly below the analog circuit 10 can be reduced. As a result, the noises of the digital circuit 20 propagating to the analog circuit 10 through the seal ring 30 can be reduced.

In particular, in the case where the meander section 34 is arranged close to the digital circuit 20 which is a noise source, the meander section 34 is positioned away from the analog circuit 10 which a high-impedance portion protects from noises, so noises largely attenuated in the high-impedance portion can be further attenuated until the noises reach the analog circuit 10. Thereby, the noises of the digital circuit 20 propagating to the analog circuit 10 through the seal ring 30 can be further reduced.

Modification of Second Embodiment

Figure 6:
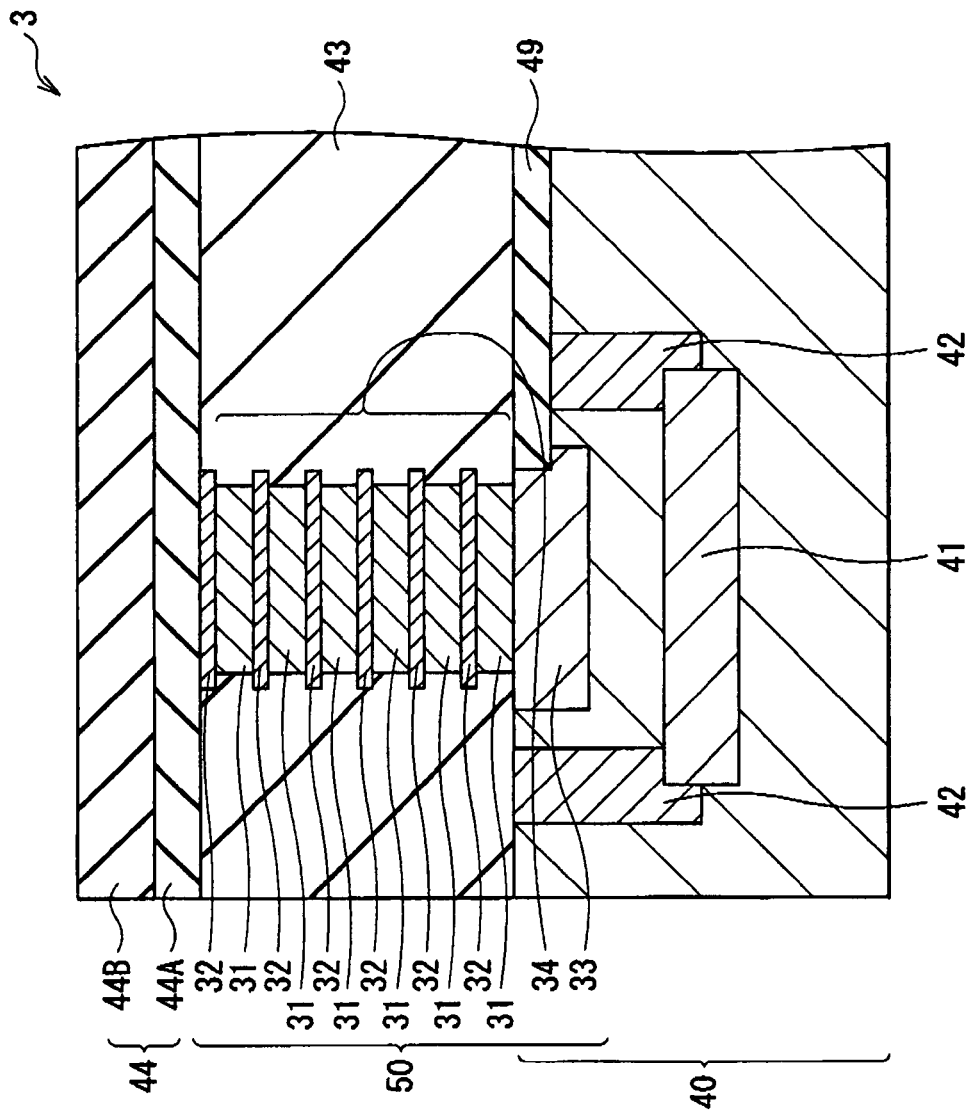
FIG. 6 is a sectional view of a semiconductor element according to a modification.

In the above-described embodiment, the meander section 34 with high impedance is arranged in the middle of each of the paths $path_2$ and $path_3$. However, as in the case of a semiconductor element 3 shown in FIG. 6, the deep n-type well layer 41 and the n-type well layer 42 in the first embodiment may be further arranged. Thereby, two high-impedance portions are connected in series in the middle of each of the paths $path_2$ and $path_3$, so the noises of the digital circuit 20 propagating to the analog circuit 10 through the seal ring 30 can be further reduced.

Third Embodiment

Figure 7:
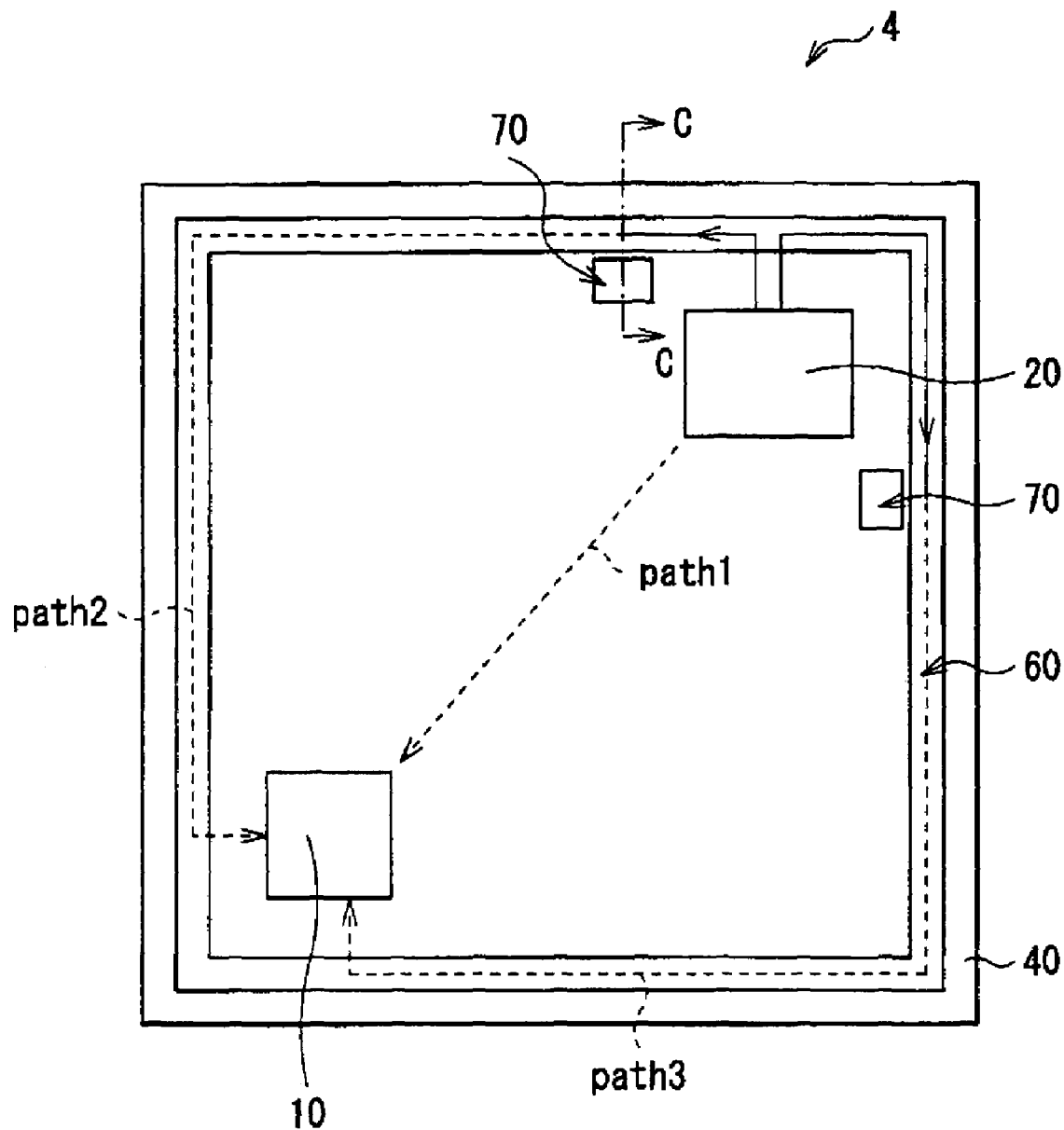
FIG. 7 is a plan view of a semiconductor element (an interlayer insulating film and a passivation layer are not shown) according to a third embodiment of the invention.
Figure 8:
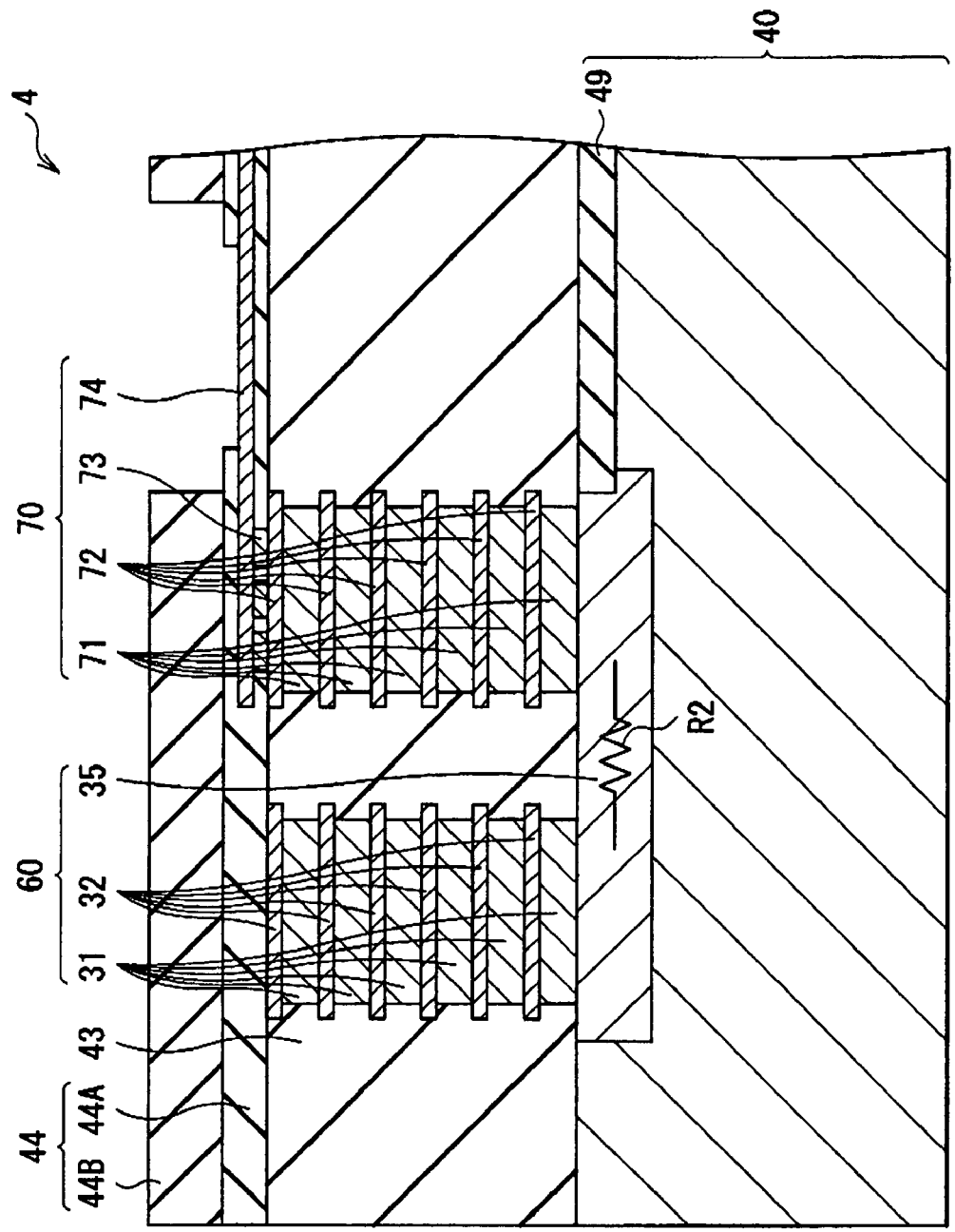
FIG. 8 is a sectional view taken along a line C-C of FIG. 7 viewed from an arrow direction.

FIG. 7 shows a plan view of a semiconductor element 4 according to a third embodiment of the invention. In FIG. 7, the interlayer insulating film 43 and the passivation layer 44 of the semiconductor element 4 are not shown. FIG. 8 shows a sectional view taken along a line C-C of FIG. 7 viewed from an arrow direction, and a resistance $R_2$ formed between the via 31 or a via 71 and the p-type semiconductor region 35 in a sectional portion.

The configuration of the semiconductor element 4 is distinguished from that in the first embodiment by the fact that the semiconductor element 4 includes a seal ring 60 including a p-type semiconductor region 35 formed by extending a portion of the high doping concentration p-type semiconductor region 33 included in the seal ring 30 in the first embodiment to a layout pattern region (a region on which the analog circuit 10 or the digital circuit 20 is arranged) inside a chip and a noise isolator 70 connected to the seal ring 60, and does not include the deep n-type well layer 41 and the n-type well layer 42 in the first embodiment. Therefore, configurations, functions and effects similar to those in the first embodiment will not be further described, and mainly differences from the first embodiment will be described below.

As shown in FIG. 8, the p-type semiconductor region 35 includes a ring-shaped portion formed in a region facing the via 31 of the p-type semiconductor substrate 40 and a portion extending from a part of the ring-shaped portion to the layout pattern region inside the chip. The noise isolator 70 has a laminate configuration in which vias 71 and wiring layers 72 are alternately laminated on a surface of a portion extending to the layout pattern region in the p-type semiconductor region 35, and the wiring layer 72 is formed in the uppermost layer of the laminate configuration. A pad 74 is connected to the wiring layer 72 in the uppermost layer through a via 73. The via 73 and the pad 74 are formed in a $SiO_2$ layer 44A, and a portion of the pad 74 is exposed to the outside.

The exposed portion of the pad 74 is arranged so as to be electrically connected to a low-impedance node (not shown) arranged outside the semiconductor element 4 or to a capacity element arranged in the semiconductor element 4, for example, a decoupling capacitor, a MIM (Metal-Insulator-Metal) capacitor, a comb-type capacitor or a capacitor arranged in an IPD (Integrated Passive Device).

Figure 9:
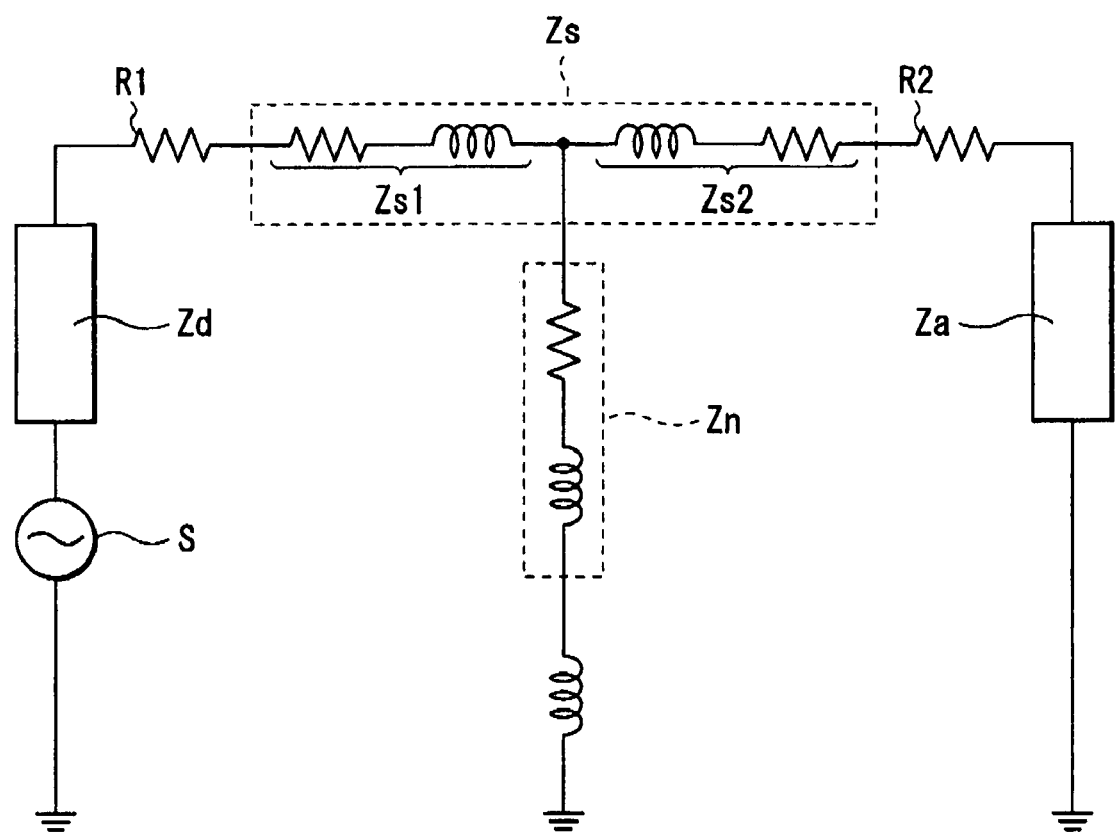
FIG. 9 is an equivalent circuit diagram of an example of the semiconductor element shown in FIG. 7.

In the case where the exposed portion of the pad 74 is electrically connected to the outside low-impedance node, the path $path_2$ or $path_3$ can be represented by an equivalent circuit shown in FIG. 9. In the equivalent circuit, the digital circuit 20 is represented as a noise source S and digital circuit impedance Zd (impedance from the digital circuit ground to the off chip ground), the seal ring 60 is represented as seal ring impedance Zs, the analog circuit 10 is represented as analog circuit impedance Za (impedance from the analog circuit ground to the off chip ground), the noise isolator 70 is presented as noise isolator impedance Zn, a path between the digital circuit 20 and the seal ring 60 in the p-type semiconductor substrate 40 is represented as a substrate resistance R1, and a path between the analog circuit 10 and the seal ring 60 in the p-type semiconductor substrate 40 is represented as a substrate resistance R2. Then, Zd, R1, Zs, R2 and Za are connected in series between the noise source S and the ground, and Zn is connected between a portion separating Zs into two impedances Zs1 and Zs2 and the ground. In other words, the analog circuit 10 and the noise isolator 70 are connected in parallel, so in this case, it is necessary for Zn to be smaller than the total of Zs2, R2 and Za which are connected in series.

Figure 10:
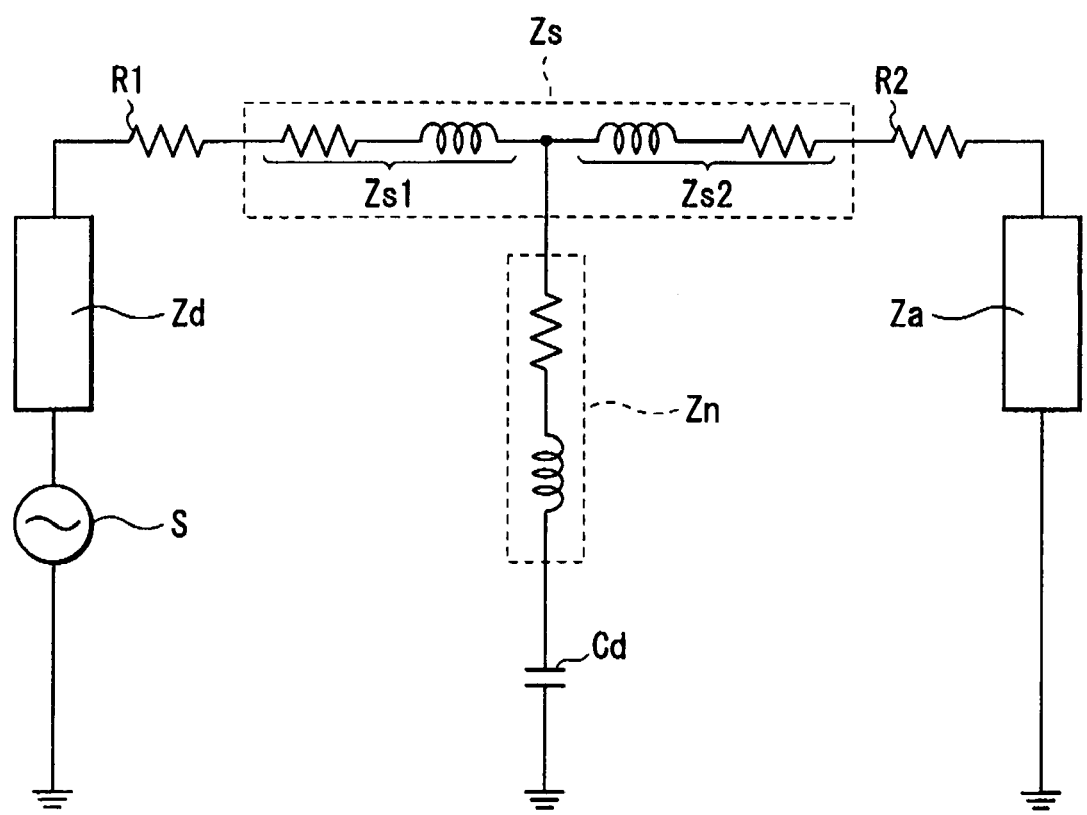
FIG. 10 is an equivalent circuit diagram of another example of the semiconductor element shown in FIG. 7.

Moreover, in the case where the exposed portion of the pad 74 is electrically connected to the capacity element arranged in the semiconductor element 4, the path $path_2$ or $path_3$ can be represented by an equivalent circuit shown in FIG. 10. In the equivalent circuit, Zd, R1, Zs, R2 and Za between the noise source S and the ground are connected in series, and Zn and a capacity Cd of the capacity element are connected between a portion separating Zs into two impedances Zs1 and Zs2 and the ground. In other words, the analog circuit 10 is connected to the noise isolator 70 and the capacity element in parallel, so in this case, it is necessary for the total impedance of Zn and Cd to be smaller than the total of Zs2, R2 and Za which are connected in series.

In the first embodiment, the deep n-type well layer 41 and the n-type well layer 42 are arranged to increase the impedances of the paths $path_2$ and $path_3$. However, in the embodiment, the noise isolator 70 with lower impedance than the impedance of a portion in parallel to the noise isolator 70 of the paths $path_2$ and $path_3$ is arranged to induce noises generated in the digital circuit 20 to the noise isolator 70. Thereby, even if the noises generated in the digital circuit 20 propagate through the paths $path_2$ and $path_3$, the noises are induced to the noise isolator 70, so the propagation of the noises to the analog circuit 10 is prevented, and the influence of the noises generated in the digital circuit 20 exerted on the potential of the p-type semiconductor substrate 40 directly below the analog circuit 10 can be reduced. As a result, the noises of the digital circuit 20 propagating to the analog circuit 10 through the seal ring 60 can be reduced.

In particular, in the case where a connecting portion between the seal ring 60 and the noise isolator 70 is arranged close to the digital circuit 20 which is a noise source, a portion in which noises are induced to the noise isolator is positioned away from the analog circuit 10 which is protected from noises, so noises induced by the noise isolator 70 to be largely attenuated can be further attenuated until the noises reach the analog circuit 10. Thereby, the noises of the digital circuit 20 propagating to the analog circuit 10 through the seal ring 60 can be further reduced.

Moreover, in the embodiment, the noise isolator 70 is arranged in a layout pattern region which can be freely designed by a designer designing the analog circuit 10 or the digital circuit 20, so the designer can freely design the noise isolator 70 satisfying a condition of the above-described equivalent circuit.

Modification of Third Embodiment

Figure 11:
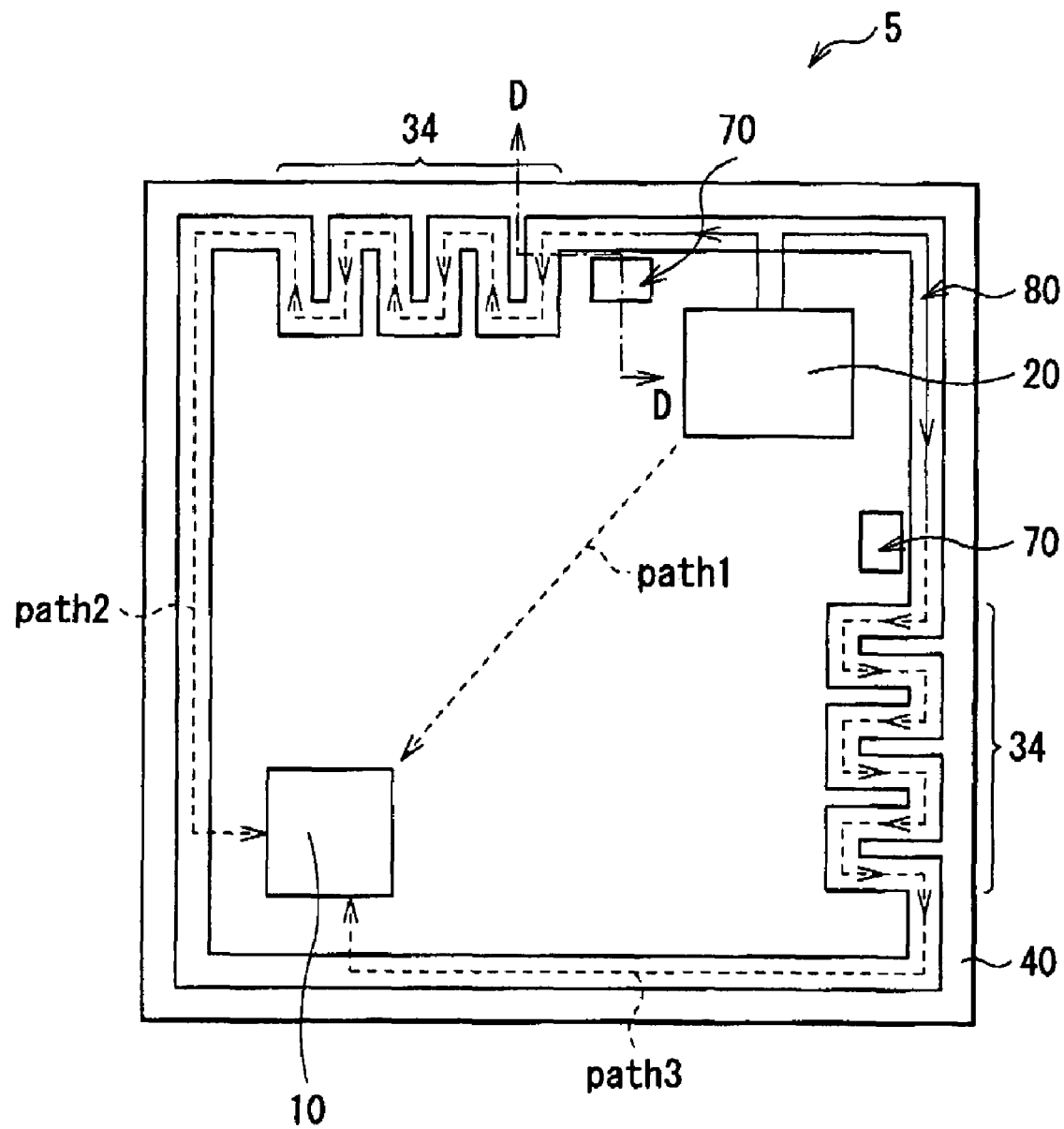
FIG. 11 is a plan view of a semiconductor element (an interlayer insulating film and a passivation layer are not shown) according to a modification.
Figure 12:
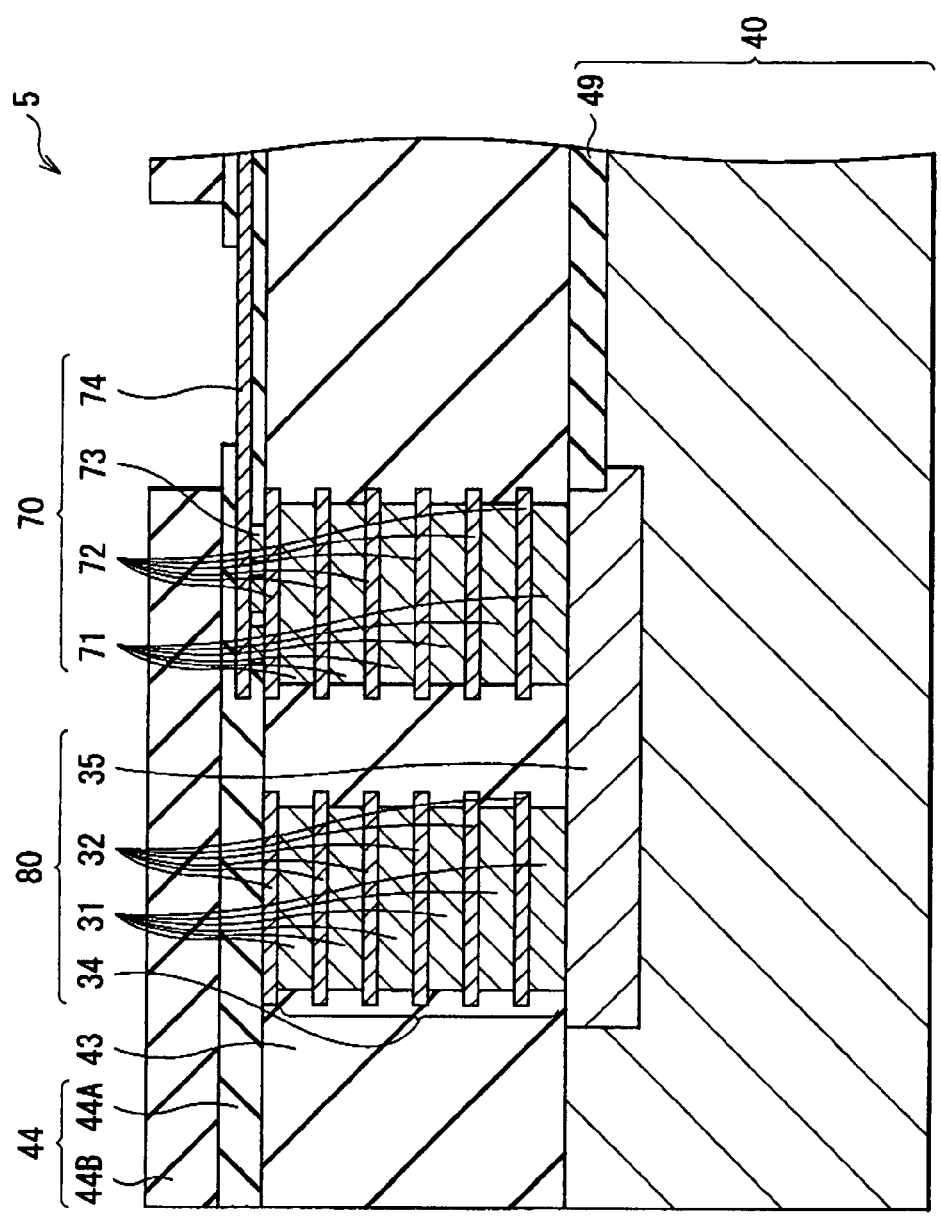
FIG. 12 is a sectional view taken along a line D-D of FIG. 11 viewed from an arrow direction.

In the above-described embodiment, the noise isolator 70 with low impedance is arranged in parallel in the middle of each of the paths $path_2$ and $path_3$. However, as shown in a semiconductor element 5 of FIGS. 11 and 12 (a sectional view taken along a line D-D of FIG. 11 viewed from an arrow direction), the meander section 34 in the second embodiment may be further arranged to form a seal ring 80. In FIG. 11, the case where the noise isolator 70 is arranged closer to the digital circuit 20 than the meander section 34 is shown as an example. However, either the noise isolator 70 or the meander section 34 may be arranged closer to the digital circuit 20. Thereby, one high-impedance portion is inserted in series in the middle of each of the paths $path_2$ and $path_3$, and the noise isolator 70 with low impedance is connected in parallel, so the noises of the digital circuit 20 propagating to the analog circuit 10 through the seal ring 80 can be further reduced.

Figure 13:
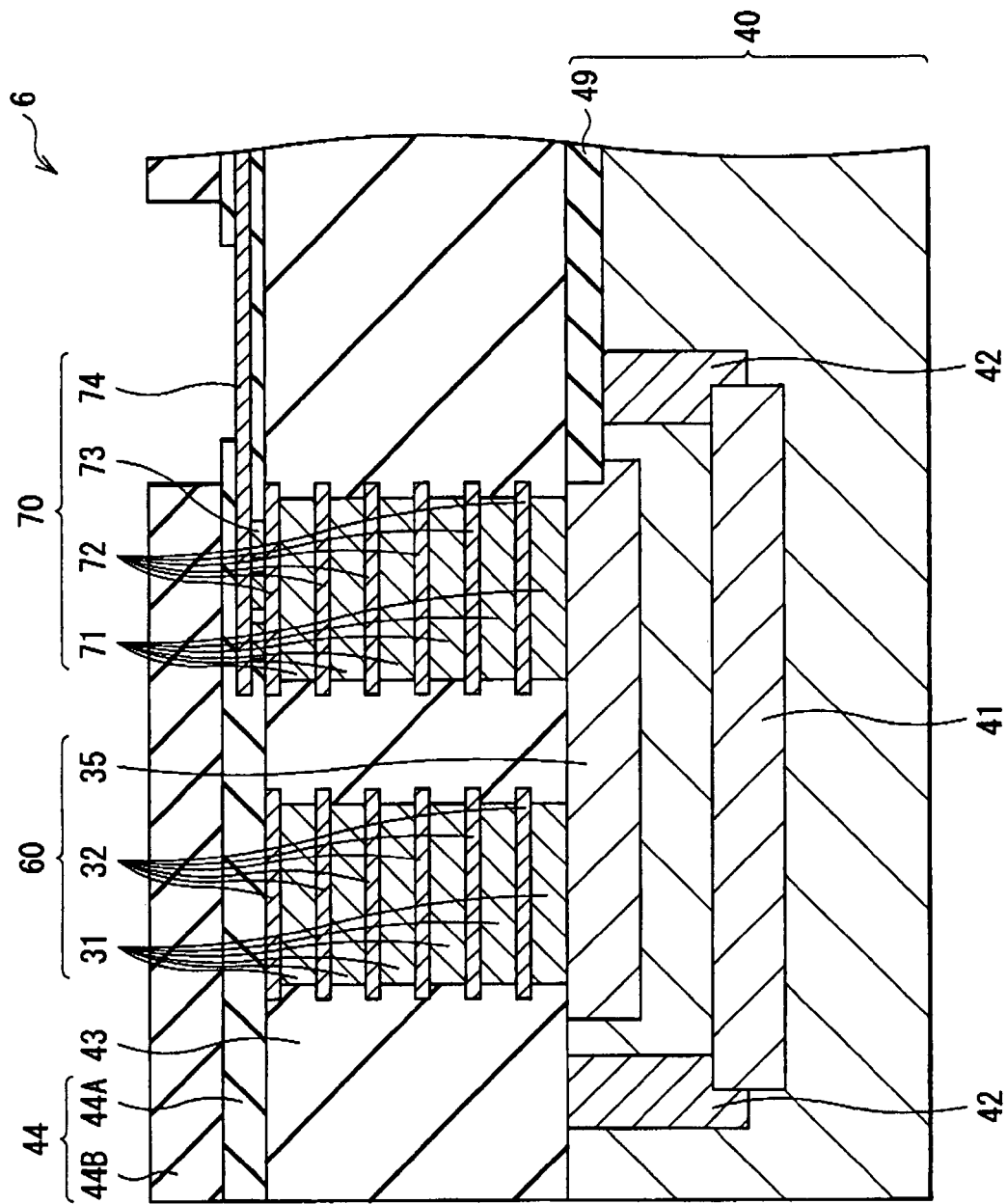
FIG. 13 is a sectional view of a semiconductor element according to another modification.

Moreover, as shown in a semiconductor element 6 shown in FIG. 13, as in the case of the first embodiment, the deep n-type well layer 41 and the n-type well layer 42 may be arranged in the semiconductor element 4 in the third embodiment. In this case, not only the seal ring 60 but also the noise isolator 70 is separated from the other portion of the p-type semiconductor substrate 40 by the deep n-type well layer 41 and the n-type well layer 42. Thereby, one high impedance portion is inserted in series in the middle of each of the paths $path_2$ and $path_3$, and the noise isolator 70 with low impedance is connected in parallel, so the noises of the digital circuit 20 propagating to the analog circuit 10 through the seal ring 60 can be further reduced.

Figure 14:
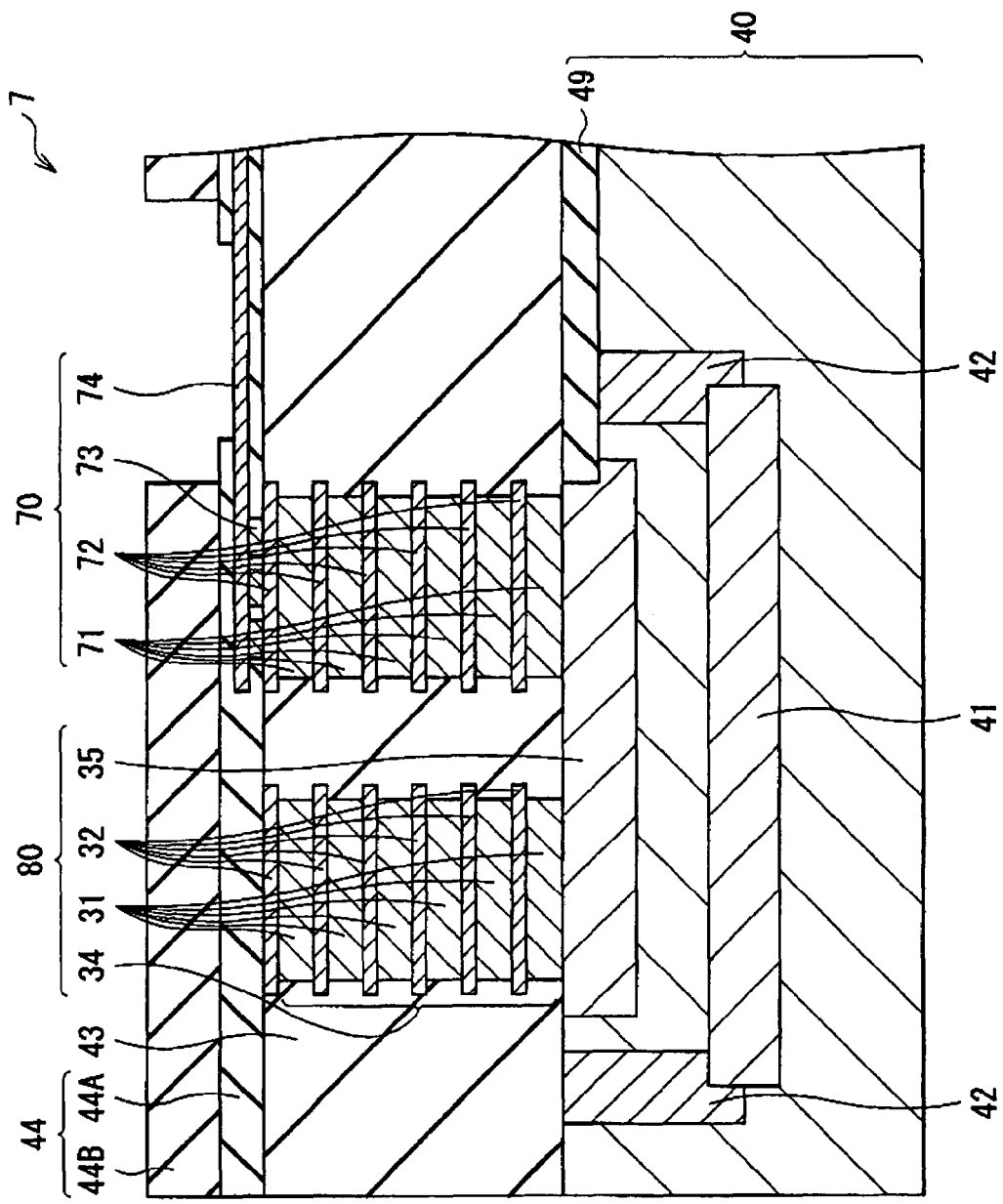
FIG. 14 is a sectional view of a semiconductor element according to still another modification.

Further, as shown in a semiconductor element 7 in FIG. 14, the semiconductor element 6 in FIG. 13 may include a seal ring 80 formed by arranging the meander section 34 in the second embodiment. Thereby, two high-impedance portions are inserted in series in the middle of each of the paths $path_2$ and $path_3$, and the noise isolator 70 with low impedance is connected in parallel, so the noises of the digital circuit 20 propagating to the analog circuit 10 through the seal ring 80 can be further reduced.

Figure 15:
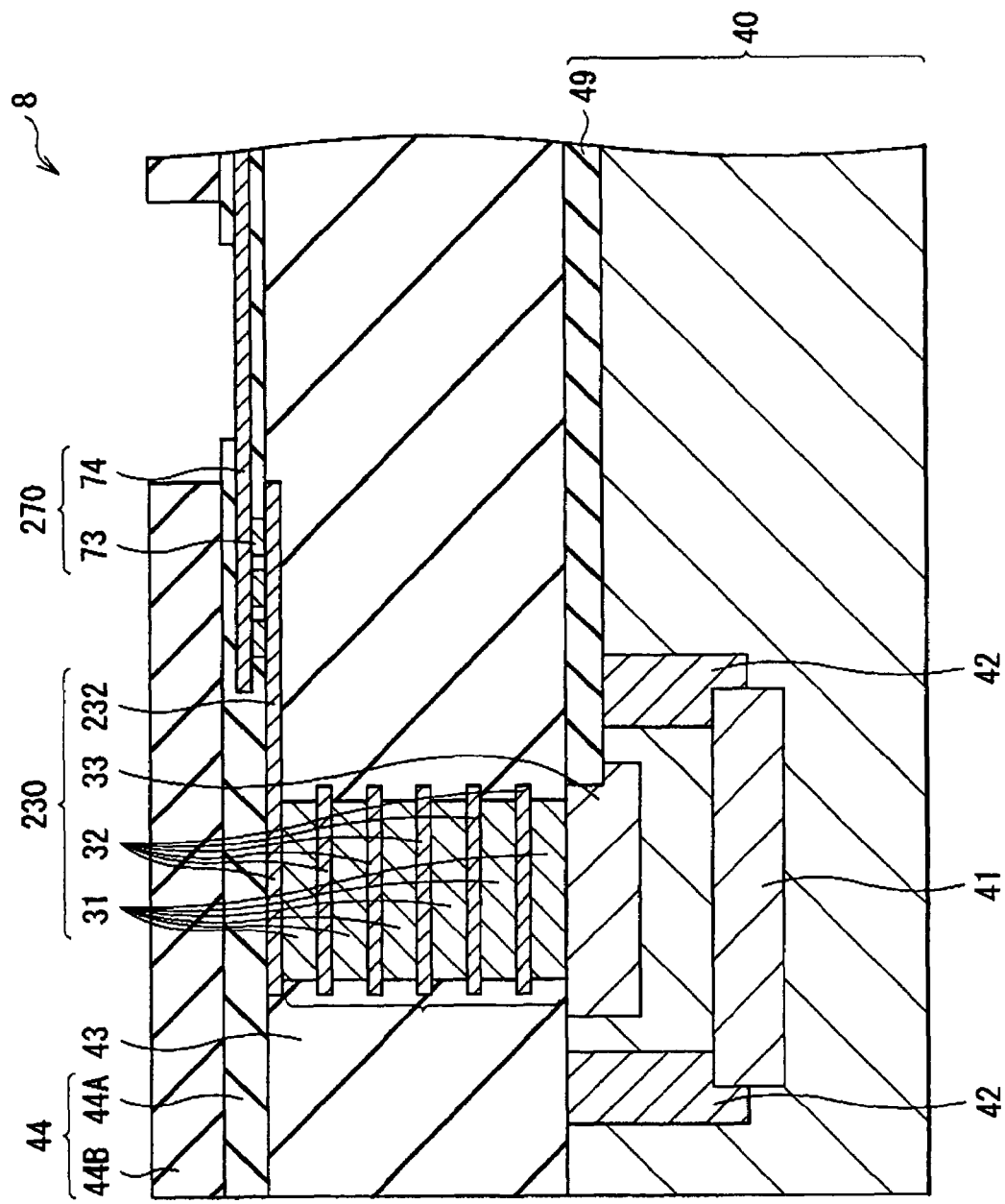
FIG. 15 is a sectional view of a semiconductor element according to a further modification.

In the third embodiment, the seal ring and the noise isolator are separately formed. However, a portion of the seal ring may be commonly used as a portion of the noise isolator. For example, as shown in a semiconductor element 8 in FIG. 15, a noise isolator 270 commonly uses the via 31 and the wiring layer 32 of a seal ring 230 as a via 71 and a wiring layer 72, and the wiring layer 32 extending from a scribe line to a layout pattern in the uppermost layer is commonly used as a wiring layer 232, and the noise isolator 270 includes the via 73 and the pad 74 connected to a surface on a side closer to the layout pattern of the wiring layer 232 on its own. In such a case, the noise isolator 270 is connected to the seal ring 230 through the wiring layer 232, so, compared to the above-described embodiment in which the noise isolator 70 is connected to the seal ring 80 through the p-type semiconductor region 35, the noise isolator 270 can be connected to the seal ring 230 with low resistance. As a result, the noises of the digital circuit 20 propagating to the analog circuit 10 through the seal ring 230 can be further reduced.

In the semiconductor element 8, the p-type semiconductor region 33 of the seal ring 230 is not used for an electrical connection between the seal ring 230 and the noise isolator 270, so the p-type semiconductor region 33 may be removed.

Fourth Embodiment

Figure 16:
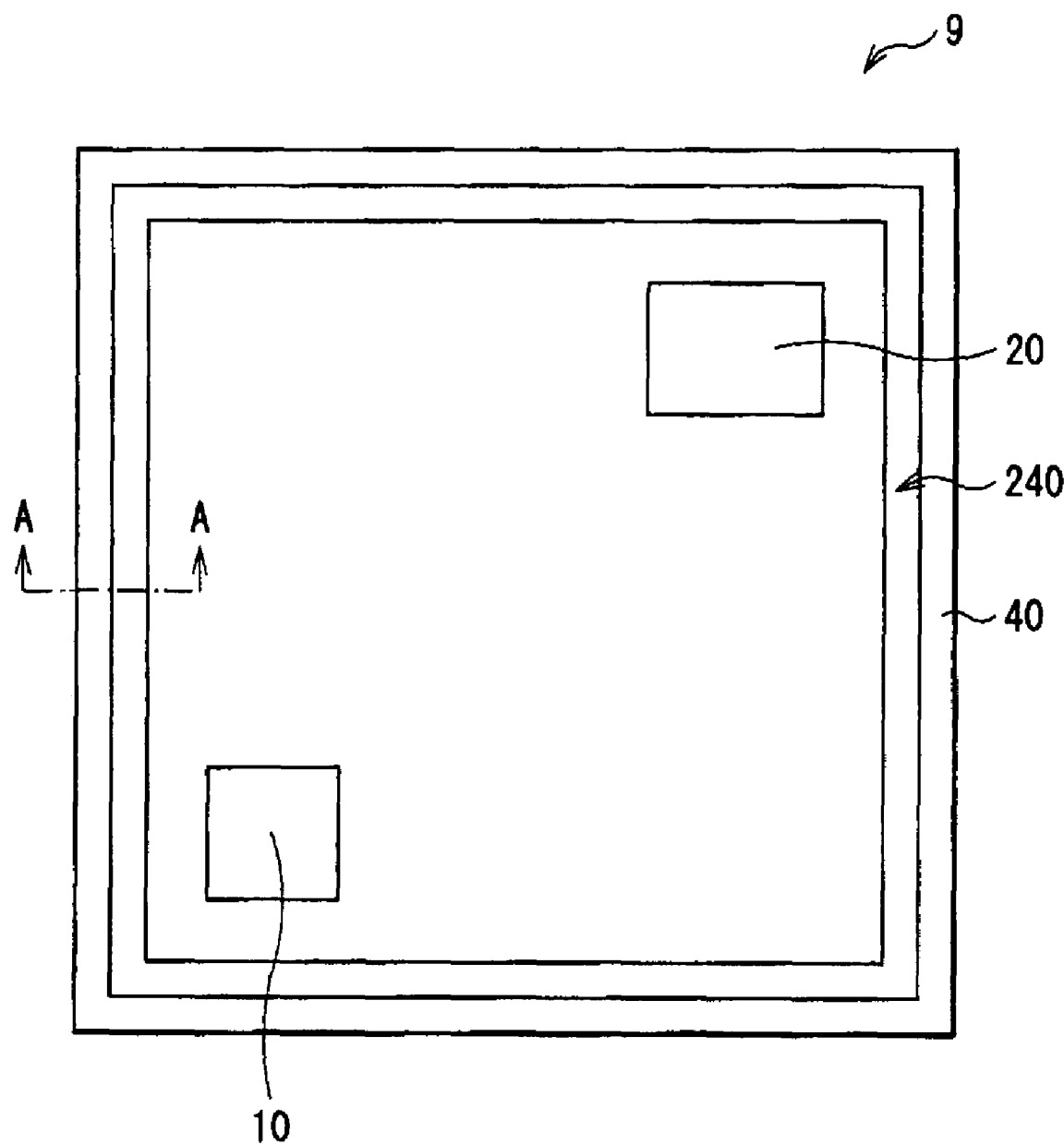
FIG. 16 is a plan view of a semiconductor element (an interlayer insulating film and a passivation layer are not shown) according to a fourth embodiment of the invention.
Figure 17:
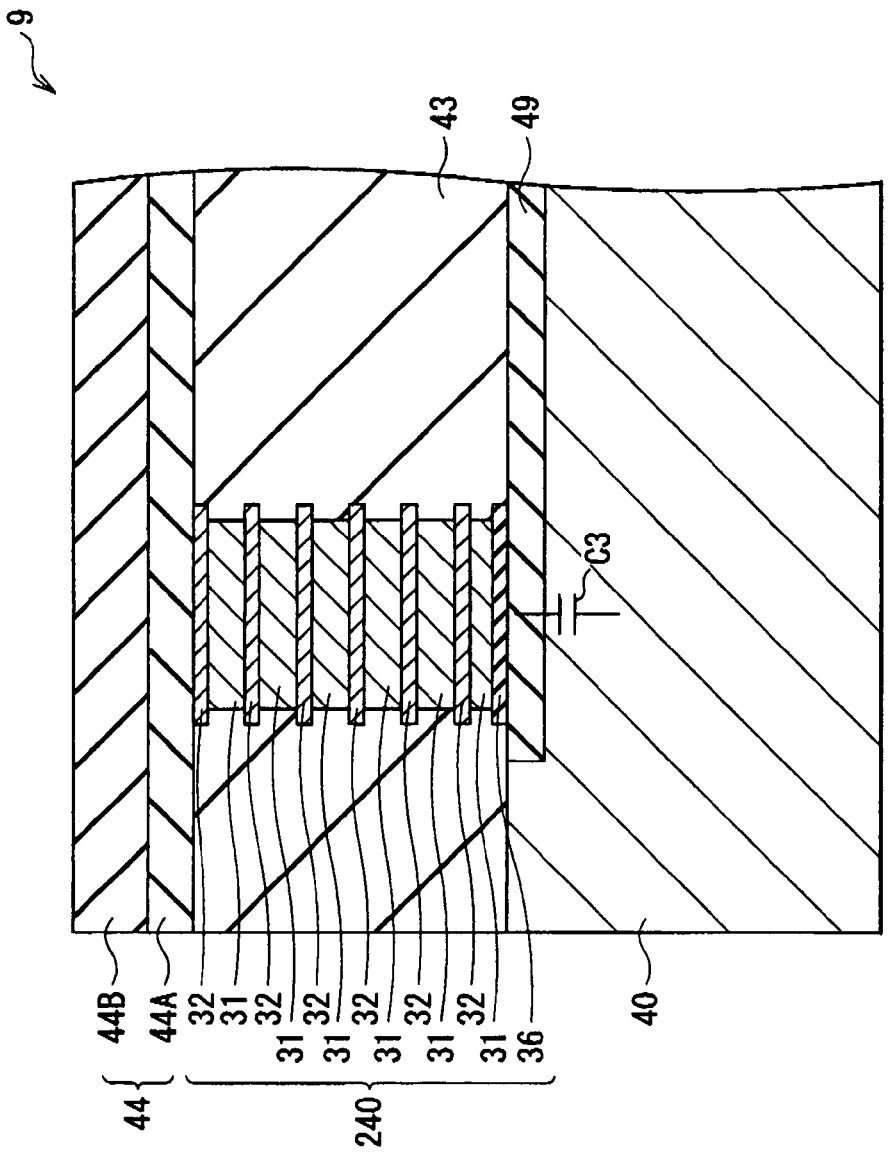
FIG. 17 is a sectional view taken along a line A-A of FIG. 16 viewed from an arrow direction.

FIG. 16 shows a plan view of a semiconductor element 9 according to a fourth embodiment of the invention. In FIG. 16, the interlayer insulating film 43 and the passivation layer 44 of the semiconductor element 9 are not shown. FIG. 17 shows a sectional view taken along a line A-A of FIG. 16 viewed from an arrow direction and a parasitic capacity $C_3$ formed between the via 31 and the p-type semiconductor region 35 in a sectional portion.

The configuration of the semiconductor element 9 is distinguished from that in the first embodiment by the fact that the semiconductor element 9 includes a seal ring 240 on the p-type semiconductor substrate 40, and the p-type semiconductor region 33, the deep n-type well layer 41 and the n-type well layer 42 are not included. Therefore, configurations, functions and effects similar to those in the first embodiment will not be further described, and mainly differences from the first embodiment will be described below.

The seal ring 240 is formed on a surface of an edge portion (a scribe line region on a wafer before cutting the semiconductor element 1 into a chip) of the p-type semiconductor substrate 40 and has a ring shape surrounding the analog circuit 10 and the digital circuit 20 on the surface of the p-type semiconductor substrate 40. Moreover, the seal ring 240 has a laminate configuration in which vias 31 and wiring layers 32 are alternately laminated on a polysilicon film 36 formed on the surface of the p-type semiconductor substrate 40. Thereby, the seal ring 240 prevents a decline in reliability of the analog circuit 10 and the digital circuit 20 caused by the entry of water, ions or the like into them. Moreover, the seal ring 240 prevents chipping occurring during a dicing process in which the wafer is separated along the scribe line region from reaching inside the chip. The polysilicon film 36 can function as an etching stop layer when forming a hole for arranging the vias 31 and the wiring layers 32 in a manufacturing process.

Moreover, the seal ring 240 comes into contact with the p-type semiconductor substrate 40 through the polysilicon film 36 and the element separation insulating film 49. Therefore, as shown in FIG. 17, a capacity $C_3$ is formed by a capacitor formed by the vias 31, the polysilicon film 36 and the p-type semiconductor substrate 40. In this case, the polysilicon film 36 can be formed at the same time when a gate electrode of a CMOS is formed, and is formed of LOCOS (local oxidation of silicon) or STI (Shallow Trench Isolation), and has a sufficient thickness. Therefore, the magnitude of the capacity $C_3$ is extremely small, and the impedance relative to high frequency is high. So, even if noises generated in the digital circuit 20 propagates through the paths path$_2$ and path$_3$, the influence exerted on the potential of the p-type semiconductor substrate 40 can be reduced. As a result, the noises of the digital circuit 20 propagating the analog circuit 10 through the seal ring 240 can be reduced.

Modification of Fourth Embodiment

Figures 18A, 18B:
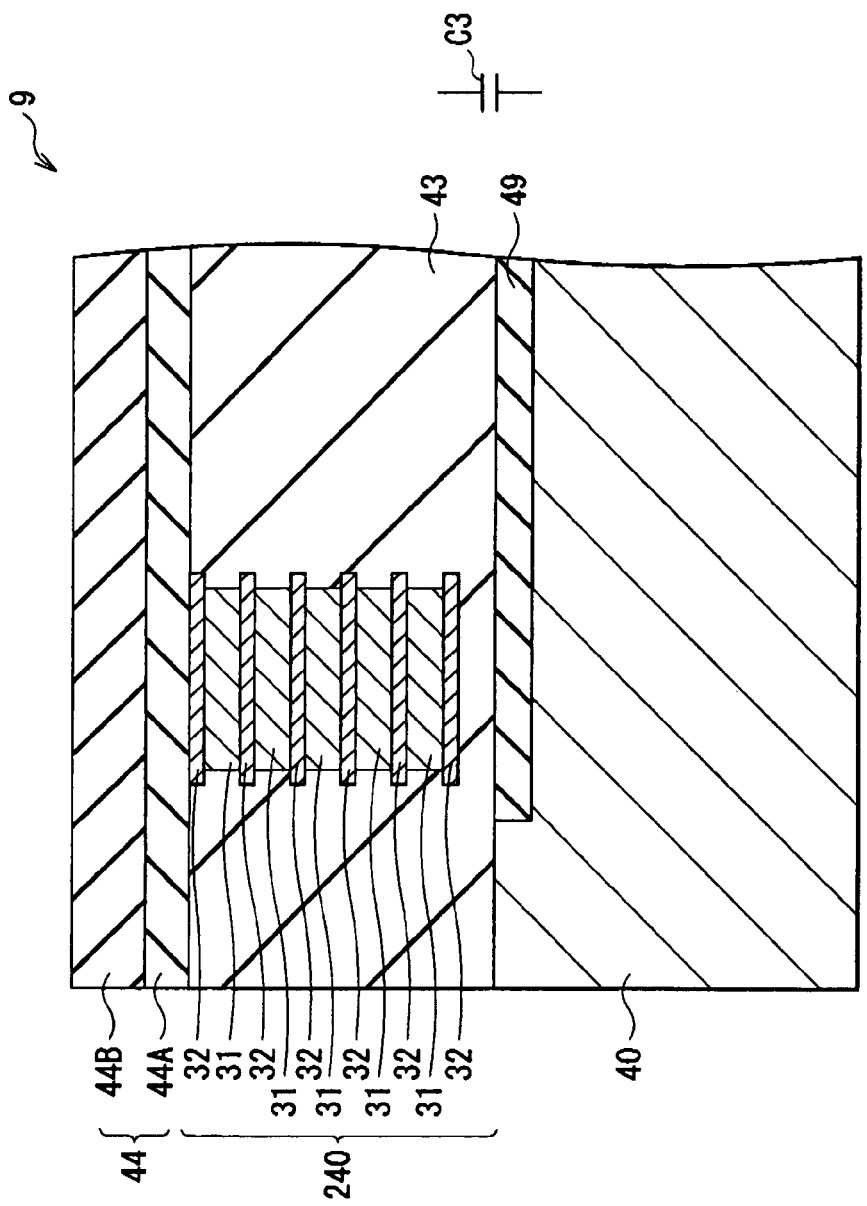
FIGS. 18A and 18B are sectional views of a semiconductor element according to a modification.

In the above-described embodiment, the polysilicon film 36 and the element separation insulating film 49 are arranged in the lowermost portion of the seal ring 240, and the seal ring 240 is separated from the p-type semiconductor substrate 40. However, as shown in FIGS. 18A and 18B, when the interlayer insulating film 43 is arranged instead of the polysilicon film 36 and the wiring layer 32 and the via 31, which are formed adjacent to the polysilicon film 36, the seal ring 240 can be separated from the p-type semiconductor substrate 40.

Figures 19A, 19B:
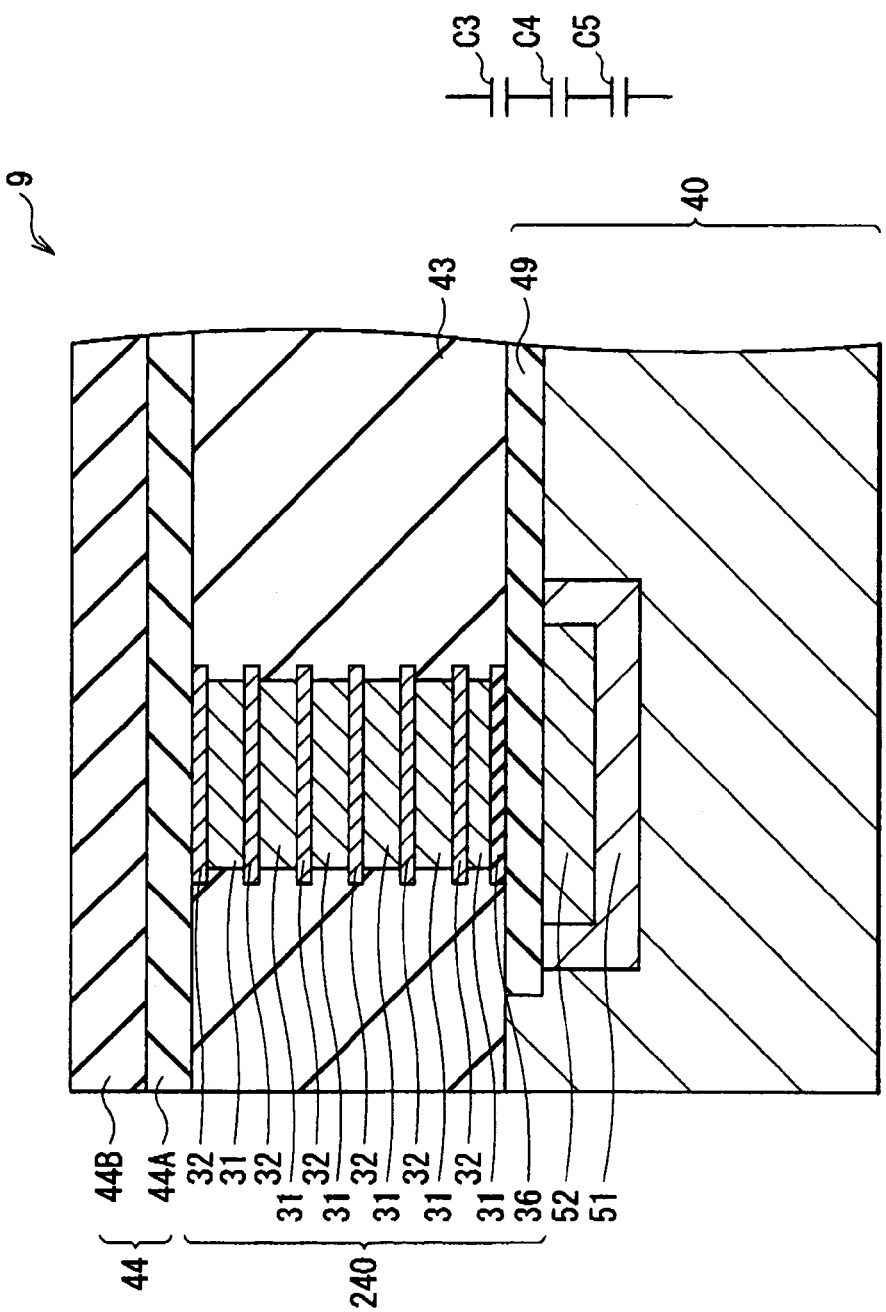
FIGS. 19A and 19B are sectional views of a semiconductor element according to another modification.

Moreover, a multilayer semiconductor layer formed by alternately laminating two or more semiconductor layers of different conductivity types may be formed in a region facing the seal ring 240 of a surface of the p-type semiconductor substrate 40. For example, as shown in FIG. 19A, in the case where a p-type semiconductor layer 52 and an n-type semiconductor layer 51 are formed in this order from the seal ring 240 on the surface of the p-type semiconductor substrate 40, as shown in FIG. 19B, in addition to the capacity $C_3$, a parasitic capacity $C_4$ is formed by a pn junction formed at an interface between the p-type semiconductor layer 52 and the n-type semiconductor layer 51, and a parasitic capacity $C_5$ is further formed by a pn junction formed at an interface between the n-type semiconductor layer 51 and the p-type semiconductor substrate 40. The parasitic capacities $C_4$ and $C_5$ are connected to the capacity $C_3$ in series. Thereby, the magnitude of a capacity between the p-type semiconductor substrate 40 and the seal ring 240 can be extremely small, and the impedance relative to high frequency can be increased. So, even if noises generated in the digital circuit 20 propagate through the paths path$_2$ and path$_3$, the influence exerted on the potential of the p-type semiconductor substrate 40 can be reduced. As a result, the noises of the digital circuit 20 propagating to the analog circuit 10 through the seal ring 240 can be reduced.

Modifications of Above-described Embodiments and Modifications

In the above-described embodiments and modifications, to reduce noises propagating through the paths path$_2$ and path$_3$ (refer to FIGS. 3, 4, 7, 11 and 16), various measures are taken against the paths path$_2$ and path$_3$. In addition to this, to reduce noises propagating through the paths path$_1$, path$_2$ and path$_3$, in close vicinity to the analog circuit 10, for example, as shown in FIG. 20A (a sectional view of a portion around the analog circuit 10 of the semiconductor element), a deep n-type well layer 45 and an n-type well layer 46 which separate the analog circuit 10 from the other portion of the p-type semiconductor substrate 40 may be arranged. Thereby, for example, as shown in FIG. 20B, a parasitic capacity $C_6$ is formed at an interface between the n-type source region 11 or the n-type drain region 12 of the transistor included in the analog circuit 10 and the p-type semiconductor substrate 40, a parasitic capacity $C_7$ is formed at an interface between the deep n-type well layer 45 and the n-type well layer 46 on a side closer to the analog circuit 10, and a parasitic capacity $C_8$ is formed at an interface between the deep n-type well layer 45 and the n-type well layer 46 on a side opposite to the side closer to the analog circuit 10. Thereby, the analog circuit 10 is electrically connected to the p-type semiconductor substrate 40 through the parasitic capacities $C_6$, $C_7$ and $C_8$ which are connected in series. So, compared to the case where the deep n-type well layer 45 and the n-type well layer 46 are not arranged, the impedance in a high-frequency region between the analog circuit 10 and the p-type semiconductor substrate 40 can be increased. As a result, the noises of the digital circuit 20 propagating to the analog circuit 10 through the paths $path_1$, $path_2$, and $path_3$ can be further reduced.

EXAMPLES

FIGS. 21, 22, 24 to 27 show examples of results of analyzing the influence of noises generated in the digital circuit 20 on the analog circuit 10. A dashed-dotted line in FIG. 21 indicates an example of the result of Example 1, a solid line in FIG. 21 indicates an example of the result of Example 2, a solid line in FIG. 22 indicates an example of the result of Example 3, a solid line in FIG. 24 indicates an example of the result of Example 4, a solid line in FIG. 25 indicates an example of the result of Example 5, a solid line in FIG. 26 indicates an example of the result of Example 6, and a solid line in FIG. 27 indicates an example of the result of Example 7. Moreover, broken lines in FIGS. 21, 24 and 26 indicate an example of the result of Comparative Example 1, and broken lines in FIGS. 22, 25 and 27 indicate an example of the result of Comparative Example 2.

Figure 23:
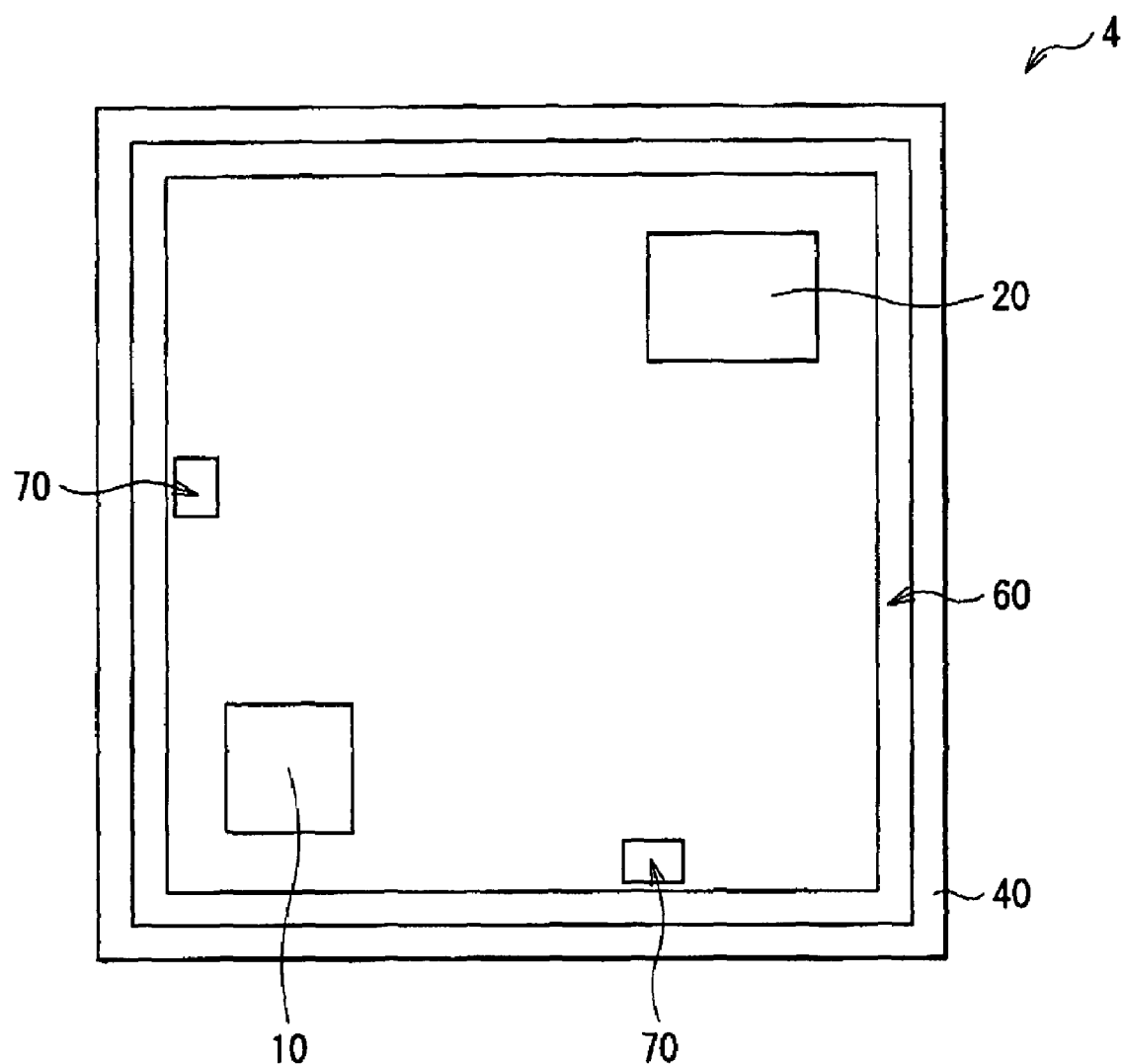
FIG. 23 is a plan view of the semiconductor element according to Example 2.
Figure 34:
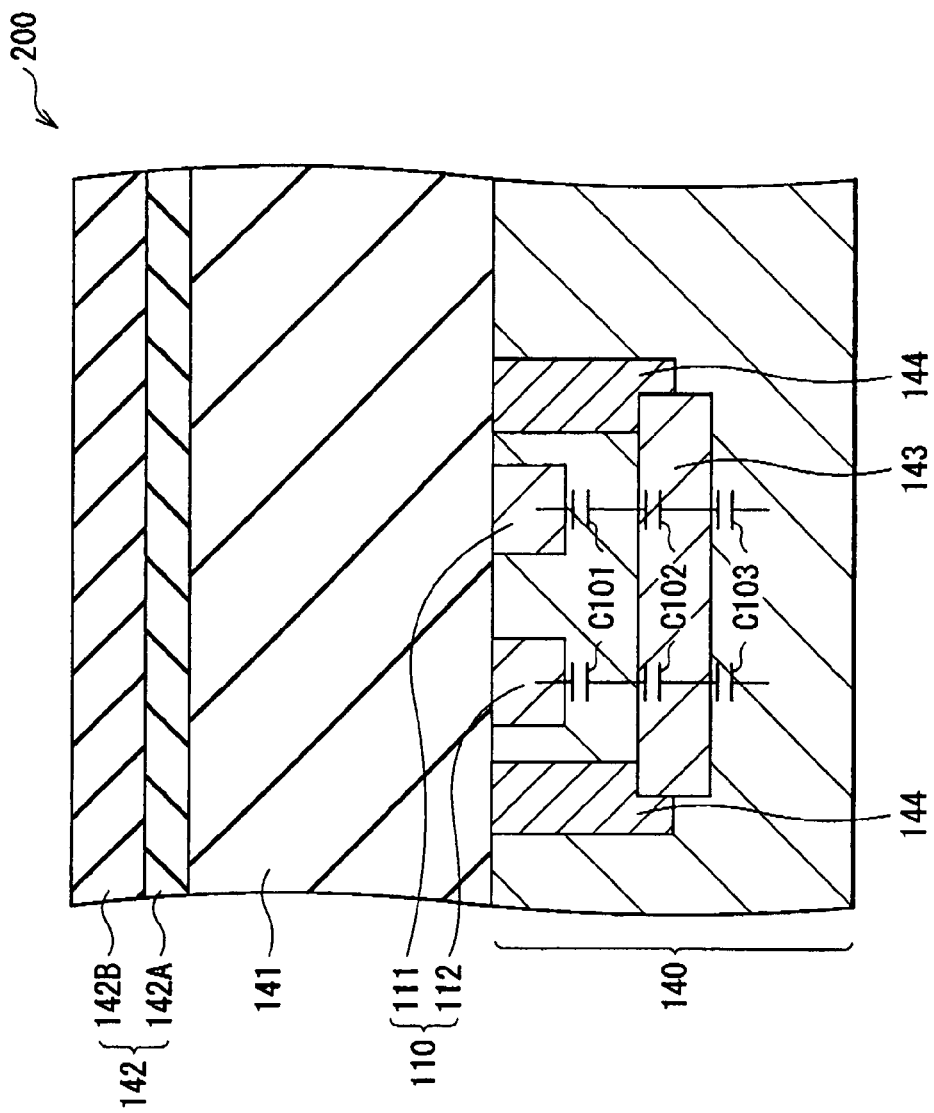
FIG. 34 is a sectional view of a semiconductor element in a related art according to a modification.
Figure 35:
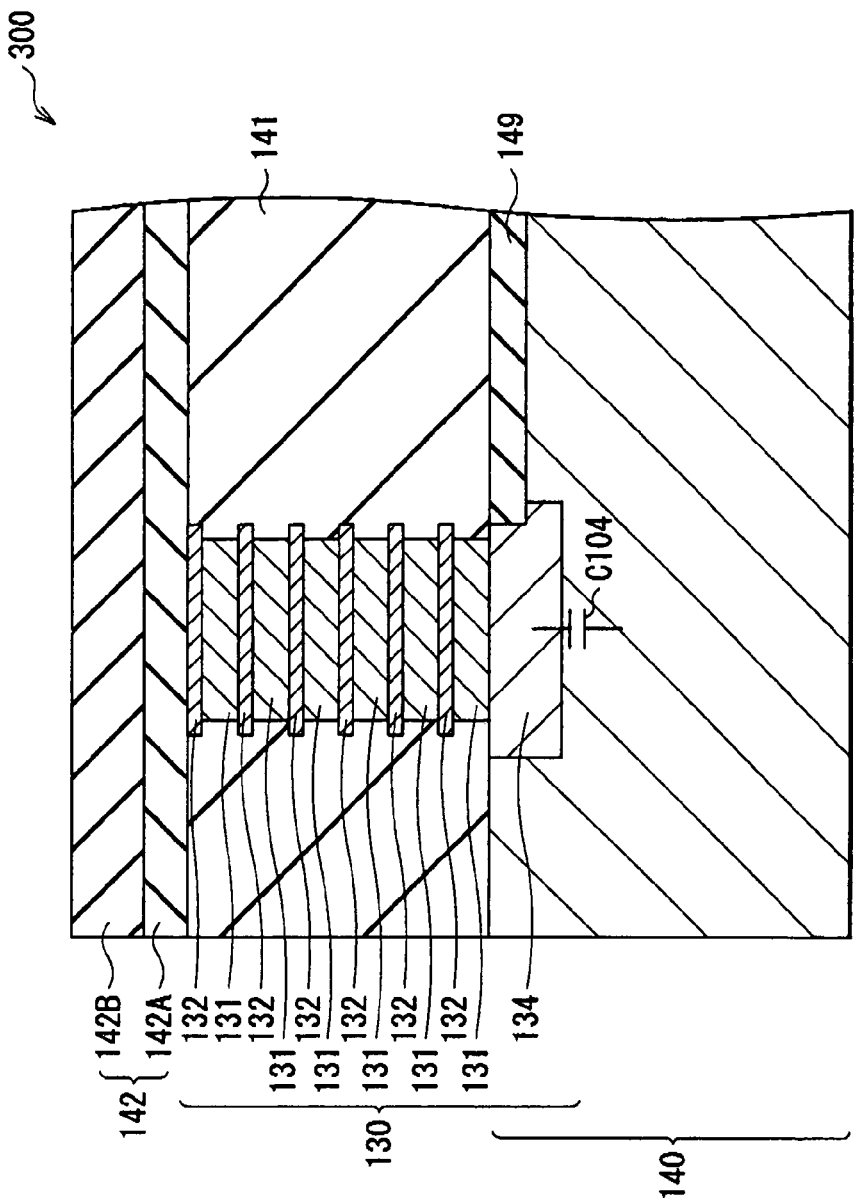
FIG. 35 is a sectional view of a semiconductor element in a related art according to another modification.
Figure 36:
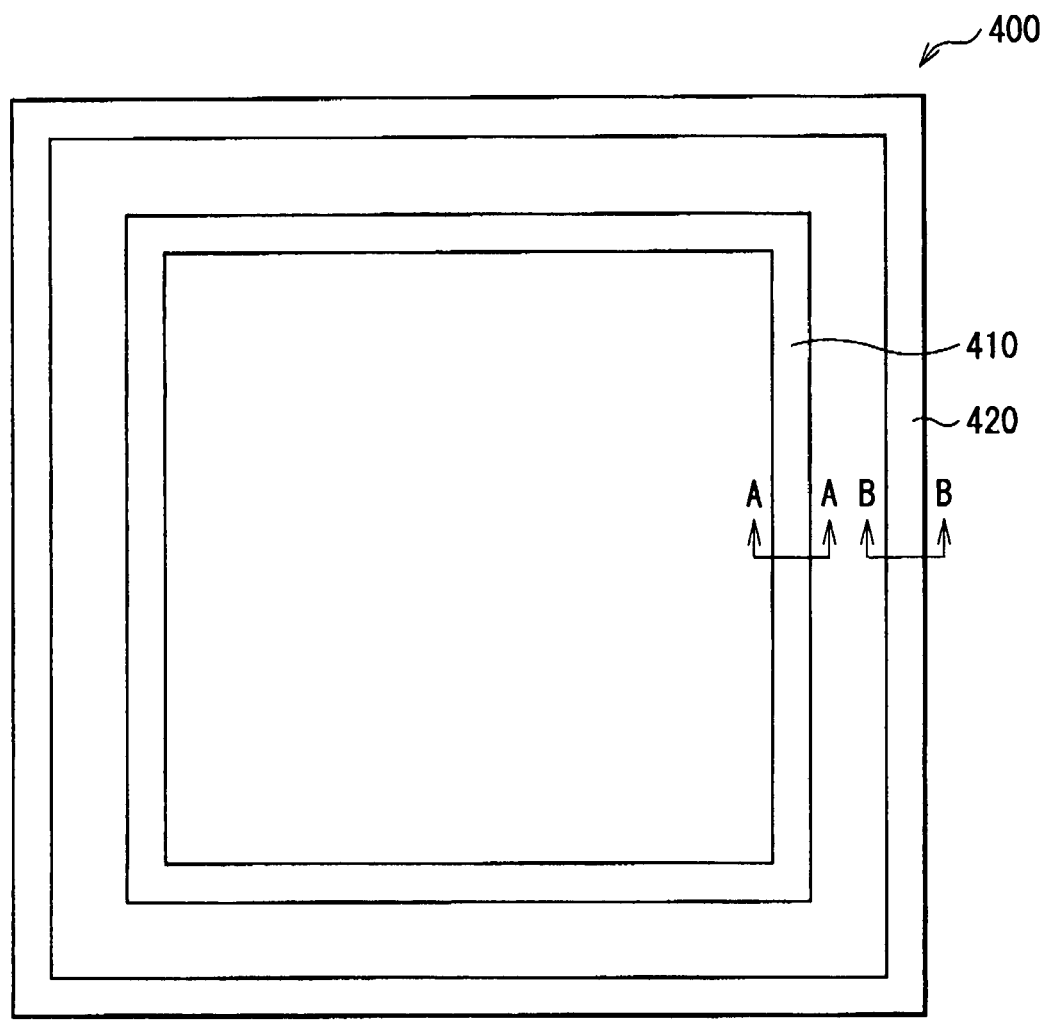
FIG. 36 is a plan view of a semiconductor element in a related art according to still another modification.
Figure 37:
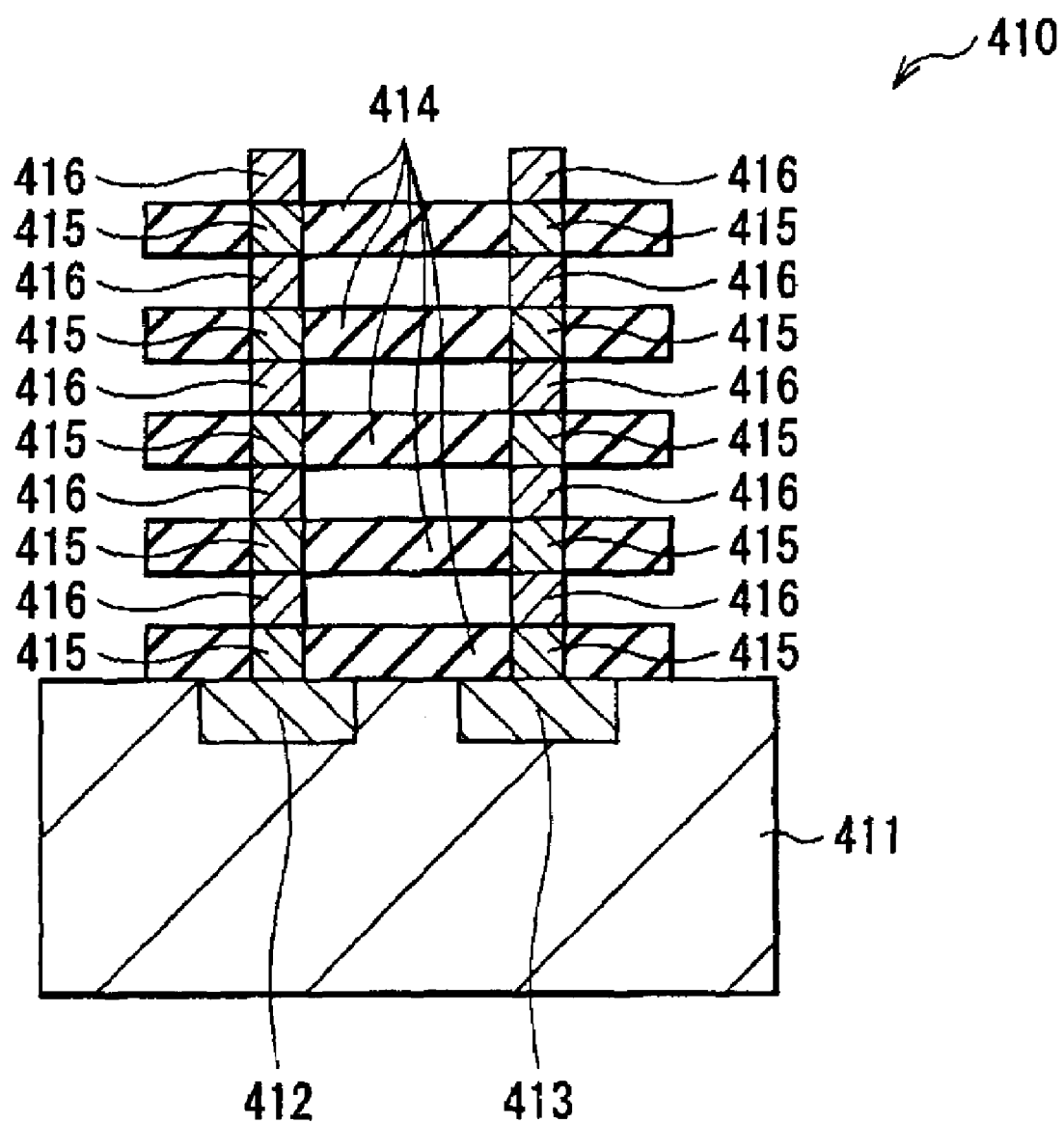
FIG. 37 is a sectional view of FIG. 36.
Figure 38:
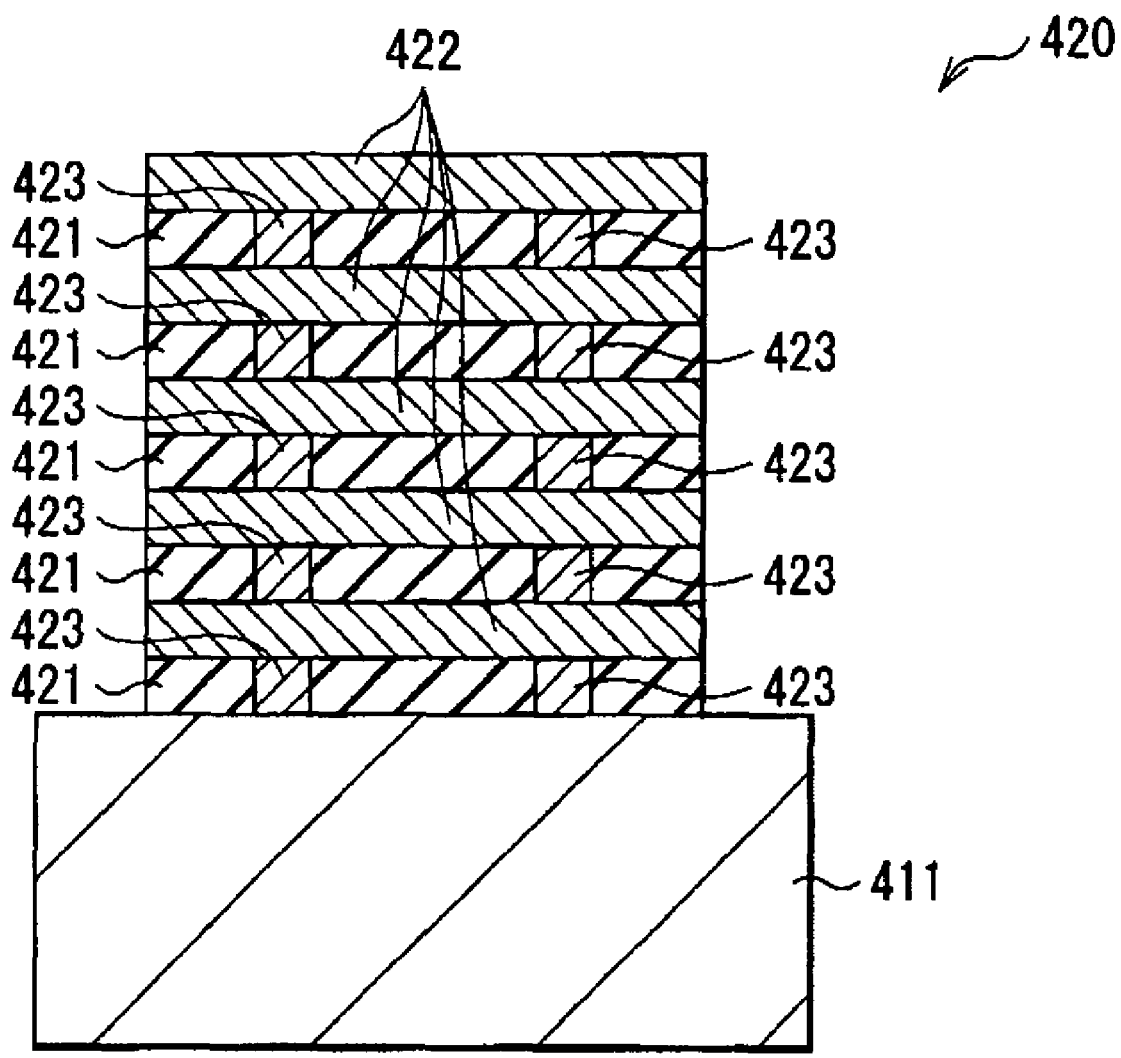
FIG. 38 is a sectional view of FIG. 36.

Example 1 is a specific example of the semiconductor element 4 according to the above-described embodiment in which the noise isolator 70 is arranged closer to the analog circuit 10 (refer to FIG. 23). Example 2 is a specific example of the semiconductor element 4 in which the noise isolator 70 is arranged closer to the digital circuit 20 (refer to FIG. 7). Example 3 is a specific example of the semiconductor element 4 with the configuration of Example 2 in which the deep n-type well layer 45 and the n-type well layer 46 are arranged directly below the analog circuit 10, as shown in FIG. 20. Example 4 is a specific example of the semiconductor element 1 according to the above-described embodiment. Example 5 is a specific example of the semiconductor element 1 with the configuration of Example 4 in which the deep n-type well layer 45 and the n-type well layer 46 are arranged directly below the analog circuit 10, as shown in FIG. 20. Example 6 is a specific example of the semiconductor element 2 according to the above-described embodiment. Example 7 is a specific example of the semiconductor element 2 with the configuration of Example 6 in which the deep n-type well layer 45 and the n-type well layer 46 are arranged directly below the analog circuit 10, as shown in FIG. 20. Comparative Example 1 is a specific example of the semiconductor element 100 shown in FIGS. 28 to 30 which does not take the measures against noises in the case of the above-described examples. Comparative Example 2 is a specific example of the semiconductor element with the configuration of Comparative Example 1 in which the deep n-type well layer 143 and the n-type well layer 144 are arranged directly below the analog circuit 110, as shown in FIG. 34.

Figure 21:
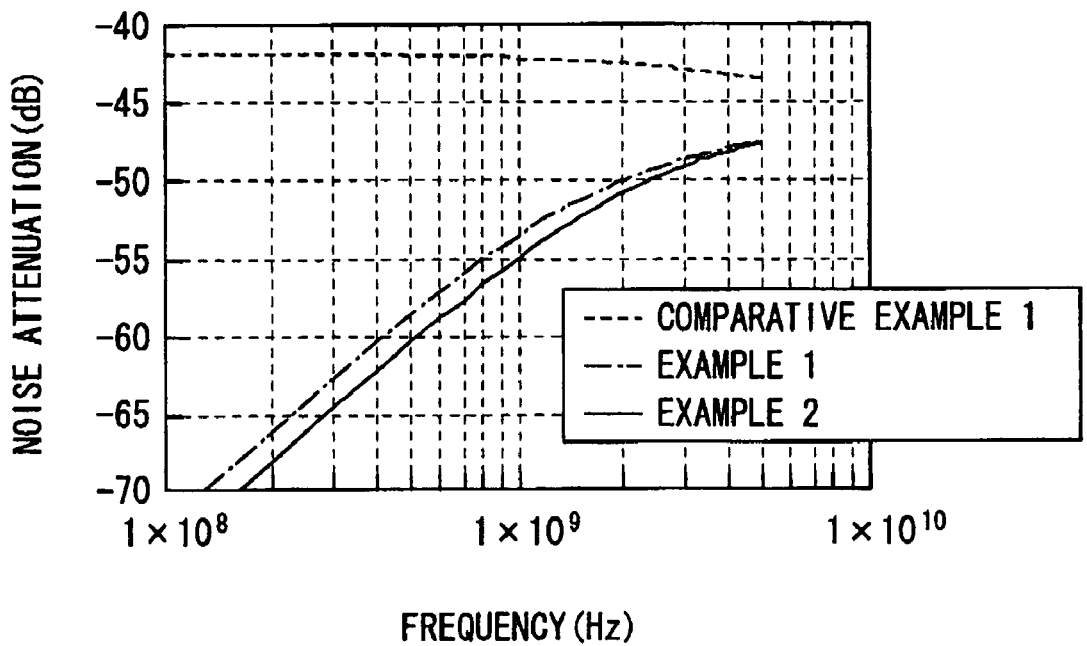
FIG. 21 is a plot showing noise characteristics of semiconductor elements according to Examples 1 and 2 and Comparative Example 1.

It was obvious from FIG. 21 that in Examples 1 and 2, compared to Comparative Example 1 in which the noise isolator was not arranged in the seal ring, the noise level was extremely lower. It was considered that it was because in Examples 1 and 2, while the inductance per one side of the seal ring 60 was 3 nH, the inductance of the noise isolator 70 was as low as 1 nH, so the impedance in the noise frequency band of the noise isolator 70 was smaller than the impedance of a path on the analog circuit 10 side from a connecting point between the noise isolator 70 and the seal ring 60 in the paths $path_2$ and $path_3$ of noises propagating from the digital circuit 20 to the analog circuit 10 through the seal ring 60, so the noises of the digital circuit 20 propagating to the analog circuit 10 through the paths $path_2$ and $path_3$ could be effectively induced to the noise isolator 70. Thereby, it was found out that when the noise isolator 70 was connected to the seal ring 60, the noises of the digital circuit 20 propagating to the analog circuit 10 through the paths $path_2$ and $path_3$ could be effectively reduced.

Moreover, it was found out that in Example 2, compared to Example 1, the noises were further reduced. It was considered that it was because when the noise isolator 70 was arranged closer to the digital circuit 20 which was a noise source, the impedance of a path on the analog circuit 10 side from a connecting point between the noise isolator 70 and the seal ring 60 in the paths $path_2$ and $path_3$ of noises propagating from the digital circuit 20 to the analog circuit 10 through the seal ring 60 was increased, so the inductance of the noise isolator 70 was relatively reduced. Thereby, it was found out that when the noise isolator 70 was arranged closer to the digital circuit 20, the noises could be reduced more effectively.

Figure 22:
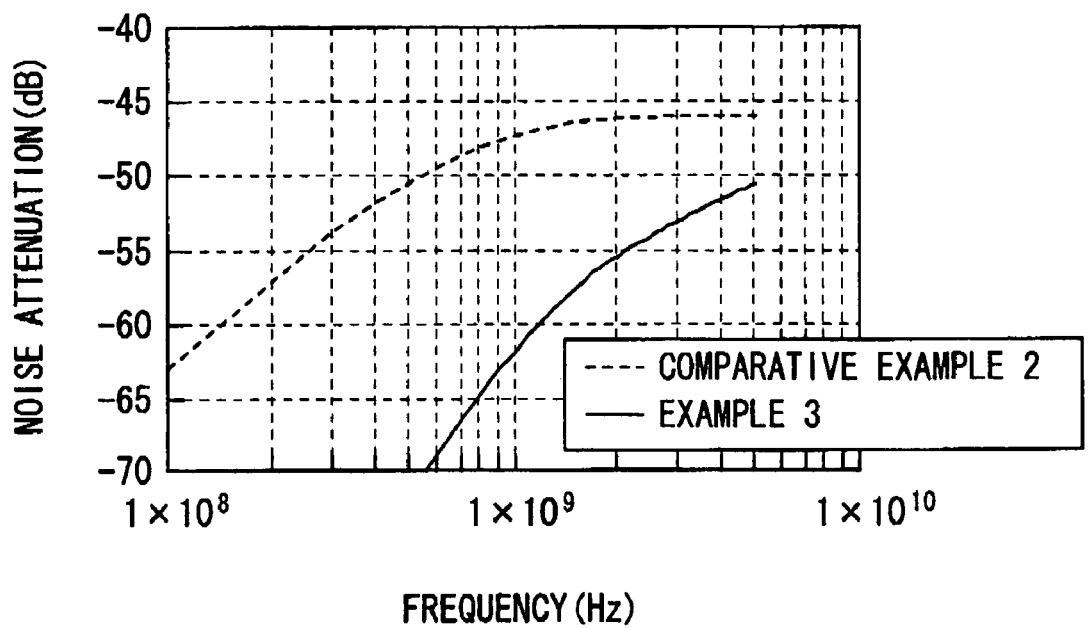
FIG. 22 is a plot showing noise characteristics of semiconductor elements according to Example 3 and Comparative Example 2.

It was obvious from FIG. 22 that in Example 3, compared to Comparative Example 2 in which the noise isolator was not arranged in the seal ring, the noise level was extremely lower. It was considered that since there was a large difference between the results, connecting the noise isolator 70 to the seal ring 60 was extremely effective to reduce noises. Thereby, it was found out that when the noise isolator 70 was connected to the seal ring 60 in addition to arranging the deep n-type well layer 45 and the n-type well layer 46 directly below the analog circuit 10, the noises of the digital circuit 20 propagating to the analog circuit 10 could be effectively reduced.

Figure 24:
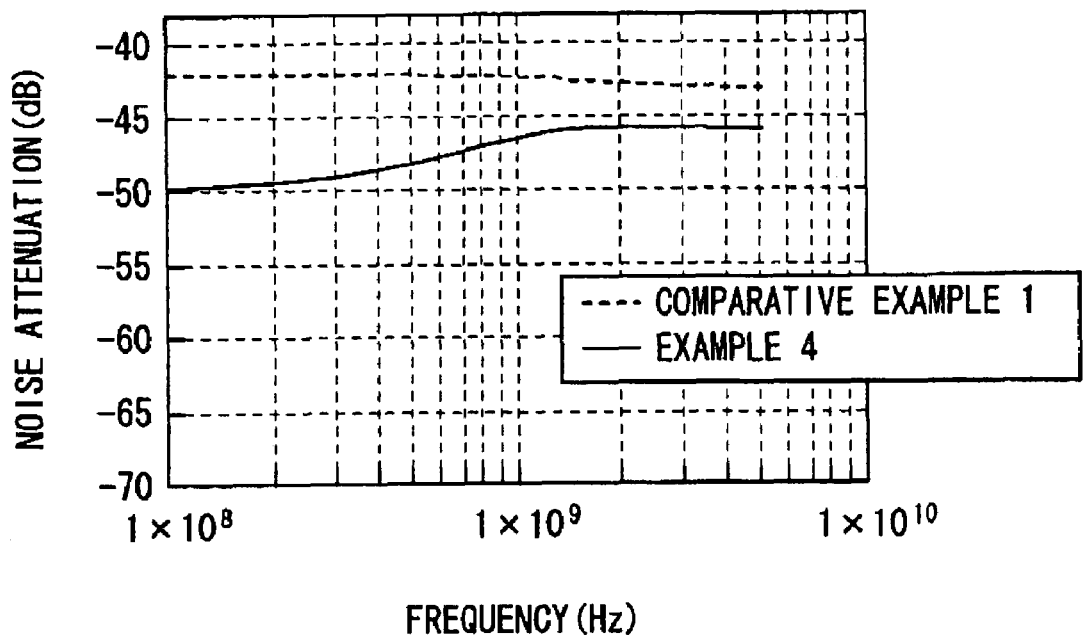
FIG. 24 is a plot showing noise characteristics of semiconductor elements according to Example 4 and Comparative Example 1.

It was obvious from FIG. 24 that in Example 4, compared to Comparative Example 1 in which the deep n-type well layer and the n-type well layer were not arranged directly below the seal ring, the noise level was substantially lower. Thereby, it was found out that when the deep n-type well layer 41 and the n-type well layer 42 were arranged directly below the seal ring 30, the noises of the digital circuit 20 propagating to the analog circuit 10 through the paths $path_2$ and $path_3$ could be effectively reduced.

Figure 25:
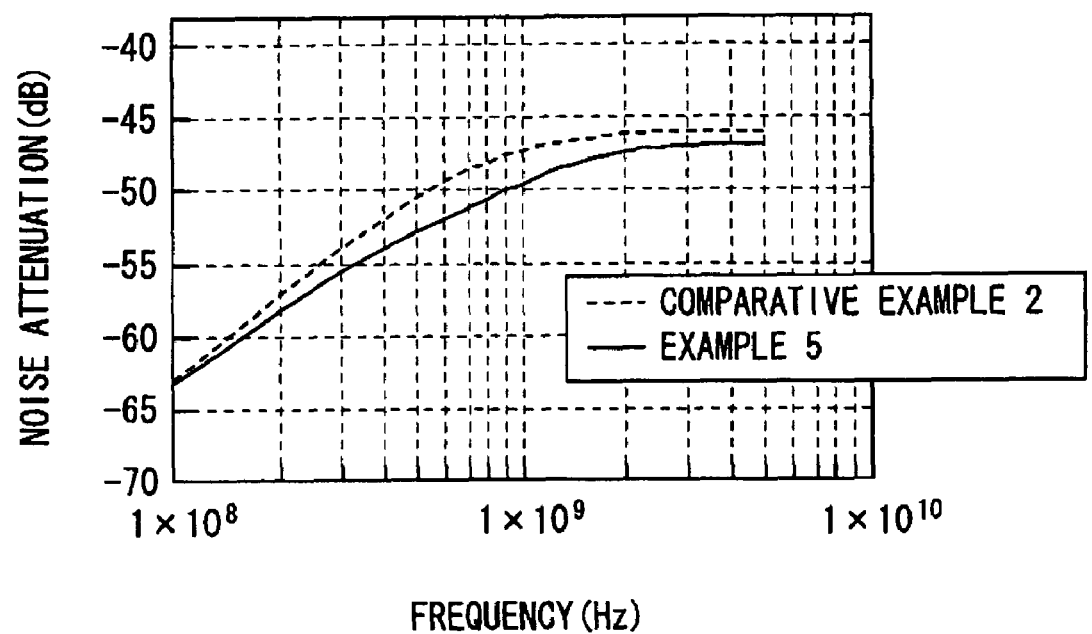
FIG. 25 is a plot showing noise characteristics of a semiconductor element according to Example 5 and Comparative Example 2.

Moreover, it was obvious from FIG. 25 that in Example 5, compared to Comparative Example 2 in which the deep n-type well layer and the n-type well layer were not arranged directly below the seal ring, the noise level was slightly lower. It was considered that it was because in Example 5, noises propagating through the paths $path_2$ and $path_3$ were attenuated by the deep n-type well layer 41 and the n-type well layer 42 before the noises propagated in the p-type semiconductor substrate 40, so the noises largely attenuated by a high-impedance portion (the deep n-type well layer 41 and the n-type well layer 42) were further attenuated until the noises reached the analog circuit 10. Thereby, it was found out that when the deep n-type well layer 41 and the n-type well layer 42 were arranged directly below the seal ring 30 in addition to arranging the deep n-type well layer 45 and the n-type well layer 46 directly below the analog circuit 10, the noises of the digital circuit 20 propagating to the analog circuit 10 through the paths $path_2$ and $path_3$ could be effectively reduced.

Figure 26:
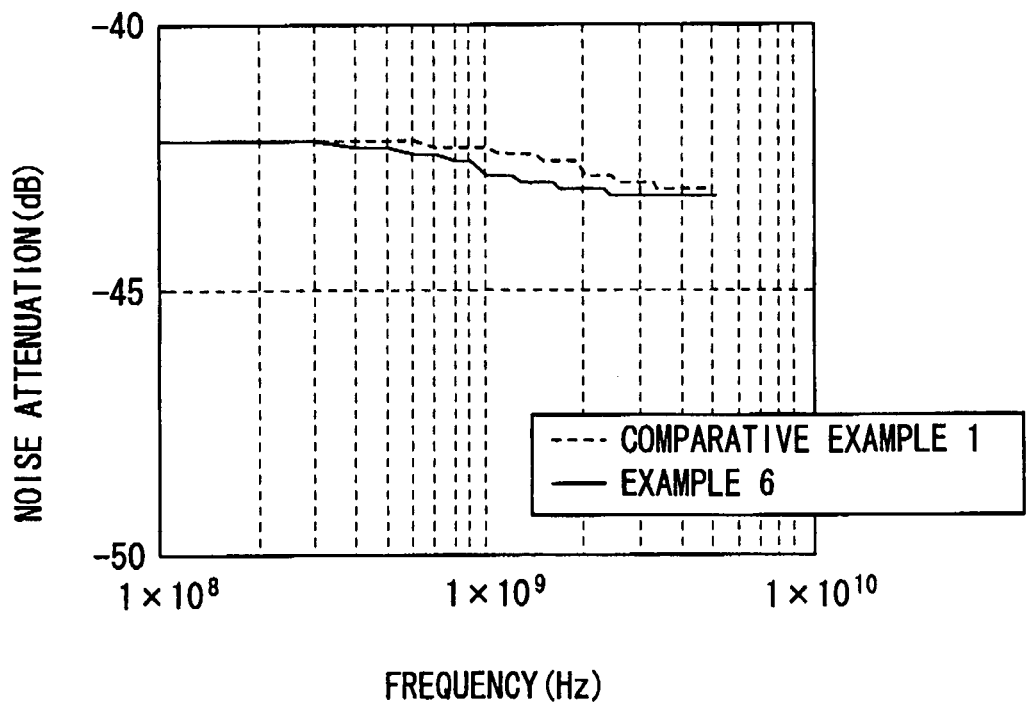
FIG. 26 is a plot showing noise characteristics of semiconductor elements according to Example 6 and Comparative Example 1.

It was obvious from FIG. 26 that in Example 6, compared to Comparative Example 1 in which the meander section was not arranged in the seal ring, the noise level was slightly lower. Thereby, it was found out that when the meander section 34 was arranged in the seal ring 50, the noises of the digital circuit 20 propagating to the analog circuit 10 through the paths path$_2$ and path$_3$ could be effectively reduced.

Figure 27:
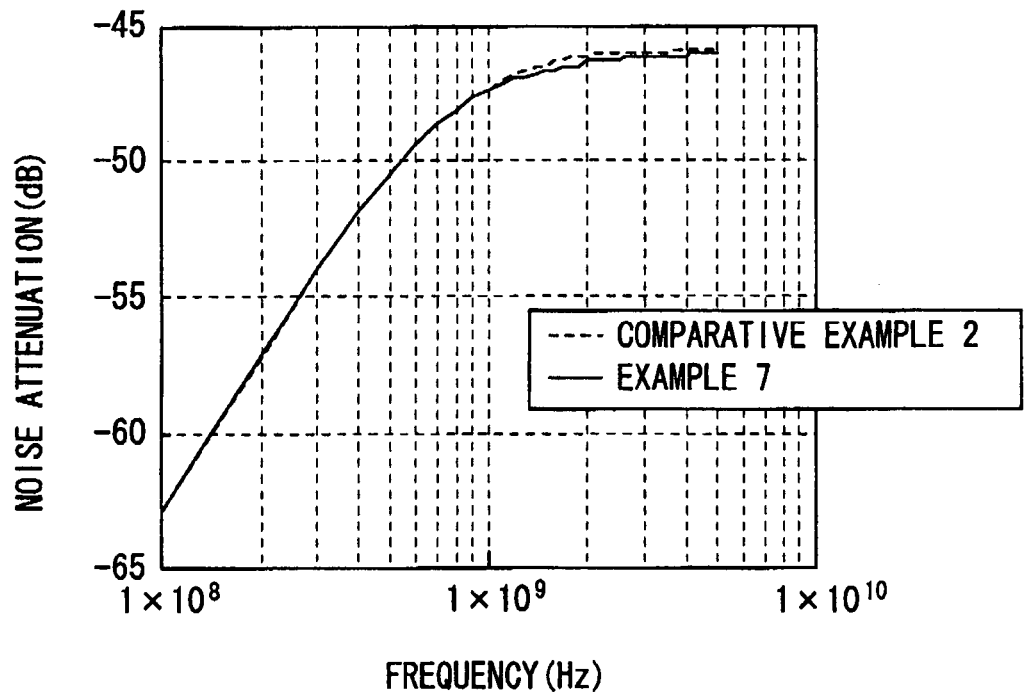
FIG. 27 is a plot showing noise characteristics of a semiconductor element according to Example 7 and Comparative Example 2.

Moreover, it was obvious from FIG. 27 that in Example 7, compared to Comparative Example 2 in which the meander section was not arranged in the seal ring, the noise level was slightly lower. It was considered that it was because in Example 7, the noises propagating through the paths path$_2$ and path$_3$ were attenuated by the meander section 34 before the noise propagated in the p-type semiconductor substrate 40, so the noises largely attenuated by a high-impedance portion (the meander section 34) were further attenuated until the noises reached the analog circuit 10. Thereby, it was found out that when the meander section 34 was arranged in the seal ring 50 in addition to arranging the deep n-type well layer 45 and the n-type well layer 46 directly below the analog circuit 10, the noises of the digital circuit 20 propagating to the analog circuit 10 through the paths path$_2$ and path$_3$ could be effectively reduced.

Applications

Figure 28:
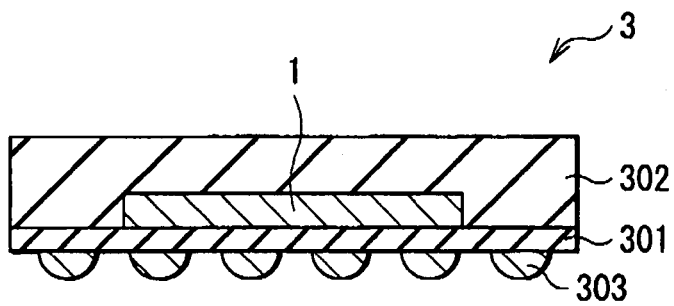
FIG. 28 is a sectional view showing an example of a semiconductor device according to an application example.
Figure 29:
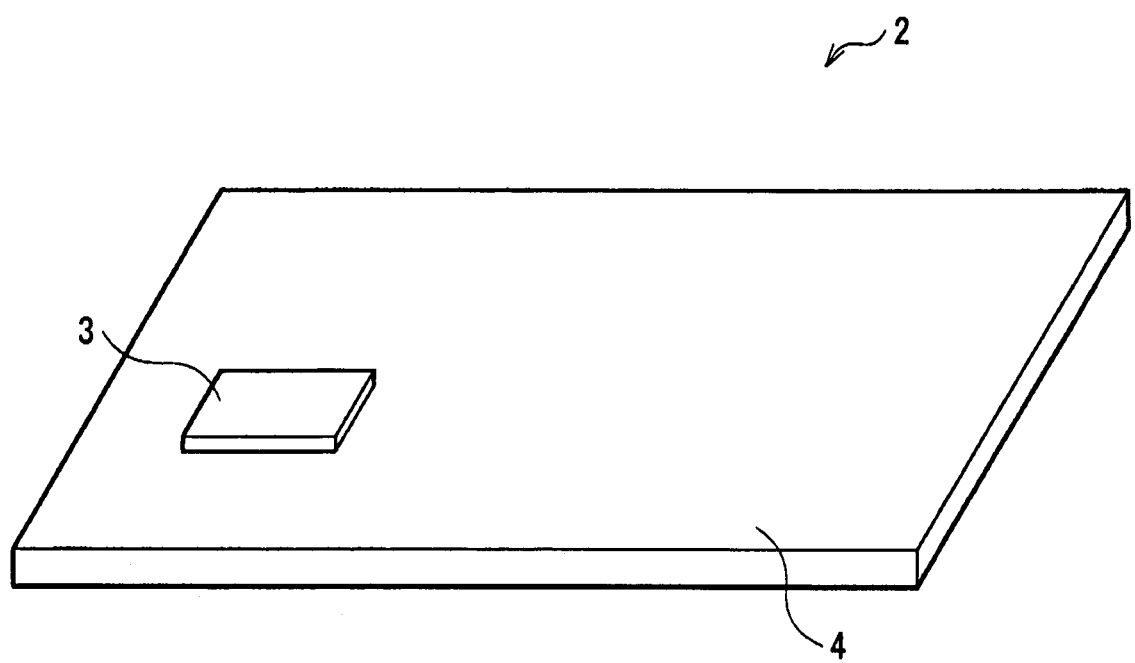
FIG. 29 is a perspective view showing an example of a mounting board according to another application example.

Each of the semiconductor elements according to the above-described embodiments and modifications is applicable to, for example, a semiconductor device 2 shown in FIGS. 28 and 29 or a mounting board 3 on which the semiconductor device 2 is mounted. In this case, the semiconductor device 2 includes, for example, the semiconductor element 1, a supporting substrate 301 fixing the semiconductor element 1, a lid body 302 which is placed over the semiconductor element 1 and protects the semiconductor element 1 from outside, and a terminal 303 which penetrates through the supporting substrate 301, and is exposed to the back surface of the supporting substrate and electrically connected to the semiconductor element 1. Moreover, the mounting board 3 includes the semiconductor device 2 and a printed circuit board 4 on which the semiconductor device 2 and other various devices are mounted.

In the semiconductor device 2 and the mounting board 3 in the application examples, for example, the semiconductor element 1 is driven by receiving power supply from a power source (not shown) connected to the mounting board 3 from the terminal 303, and a response to a signal inputted from the terminal 303 can be outputted from the terminal 303. At this time, in the semiconductor device 2, the noises of the digital circuit 20 propagating to the analog circuit 10 are effectively reduced in the semiconductor element 1, so signal processing can be performed with little influence of the noises of the digital circuit 20.

Although the present invention is described referring to the embodiments, the modifications and the examples, the invention is not limited to them, and can be variously modified.

For example, in the above-described embodiments and the like, the case where the p-type semiconductor substrate 40 is used as a common substrate is described. However, the invention is applicable to the case where an n-type semiconductor substrate is used as a common substrate. However, in this case, the conductivity type described in the above-described embodiments and the like changes from p-type to n-type, and vice versa.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor element having a semiconductor substrate and an interlayer insulating film disposed on the semiconductor substrate, the semiconductor element comprising:
   a plurality of circuits embedded in the semiconductor substrate;
   a ring-shaped seal ring surrounding the plurality of circuits as viewed in plan view and embedded in the interlayer insulating film; and
   an electrically-conductive layer electrically connected to the seal ring and having least a portion of the electrically-conductive layer being disposed exteriorly on an interlayer side of the semiconductor element.

2. A semiconductor element having a semiconductor substrate and an interlayer insulating film disposed on the semiconductor substrate, the semiconductor element comprising:
   a plurality of circuits embedded in the semiconductor substrate;
   a ring-shaped seal ring surrounding the plurality of circuits as viewed in plan view and embedded in the interlayer insulating film; and
   a combination capacitance/resistance element including a capacitance element and a resistance element electrically connected to each other in series, the combination capacitance/resistance element arranged to electrically connect the seal ring and the semiconductor substrate.

3. The semiconductor element according to claim 1 or 2, wherein
   the seal ring has a laminate configuration formed by alternately laminating vias and wiring layers.

4. The semiconductor element according to claim 1 or 2, wherein
   the seal ring is formed in an edge portion of the semiconductor substrate.

5. The semiconductor element according to claim 1 or 2, wherein
   at least one of the circuits is an analog circuit, and
   at least one of the circuits is a digital circuit.

6. The semiconductor element according to claim 1 or 2, wherein
   the semiconductor substrate is made of a first conductivity type semiconductor.

7. The semiconductor element according to claim 1 or 2, wherein
   the semiconductor substrate is made of a first conductivity type semiconductor, and
   a second conductivity type well layer separating a portion facing the seal ring of a surface of the semiconductor substrate from the other portion of the surface of the semiconductor substrate is included.

8. The semiconductor element according to claim 1 or 2, wherein
   the seal ring has a shape meandering in a direction orthogonal to an extending direction.

9. The semiconductor element according to claim 1 or 2, wherein
   the semiconductor substrate is made of a first conductivity type semiconductor,
   a second conductivity type well layer separating a portion facing the seal ring of a surface of the semiconductor substrate from the other portion of the surface of the semiconductor substrate is included, and
   the seal ring has a shape meandering in a direction orthogonal to an extending direction.

10. The semiconductor element according to claim 2, wherein
the capacitance element is a decoupling capacitor, an MIM (Metal-Insulator-Metal) capacitor, a comb-type capacitor or a capacitor arranged in an IPD (Integrated Passive Device).

11. A semiconductor device comprising:
a supporting body;
a semiconductor element being formed on one surface of the supporting body and having a semiconductor substrate and an interlayer insulating film disposed on the semiconductor substrate;
a lid body being placed over the semiconductor element; and
one or a plurality of terminals penetrating through the supporting body and being connected to the semiconductor element,
wherein the semiconductor element includes a semiconductor substrate and an interlayer insulating film disposed on the semiconductor substrate:
a plurality of circuits embedded in the semiconductor substrate;
a ring-shaped seal ring surrounding the plurality of circuits as viewed in plan view and embedded in the interlayer insulating film; and
an electrically-conductive layer electrically connected to the seal ring and having least a portion of the electrically-conductive layer being disposed exteriorly on an interlayer side of the semiconductor element.

12. A semiconductor device comprising:
a supporting body;
a semiconductor element being formed on one surface of the supporting body;
a lid body being placed over the semiconductor element; and
one or a plurality of terminals penetrating through the supporting body and being connected to the semiconductor element,
wherein the semiconductor element includes a semiconductor substrate and an interlayer insulating film disposed on the semiconductor substrate:
a plurality of circuits embedded in the semiconductor substrate;
a ring-shaped seal ring surrounding the plurality of circuits as viewed in plan view and embedded in the interlayer insulating film; and
a combination capacitance/resistance element including a capacitance element and a resistance element electrically connected to each other in series, the combination capacitance/resistance element arranged to electrically connect the seal ring and the semiconductor substrate.

13. A mounting board comprising:
a supporting substrate; and
a semiconductor device being mounted on the supporting substrate,
wherein the semiconductor device includes:
a supporting body;
a semiconductor element being formed on one surface of the supporting body;
a lid body being placed over the semiconductor element; and
one or a plurality of terminals penetrating through the supporting body and being connected to the semiconductor element, and
the semiconductor element includes a semiconductor substrate and an interlayer insulating film disposed on the semiconductor substrate:
a plurality of circuits embedded in the semiconductor substrate;
a ring-shaped seal ring surrounding the plurality of circuits as viewed in plan view and embedded in the interlayer insulating film; and
an electrically-conductive layer electrically connected to the seal ring and having least a portion of the electrically-conductive layer being disposed exteriorly on an interlayer side of the semiconductor element.

14. A mounting board comprising:
a supporting substrate; and
a semiconductor device being mounted on the supporting substrate,
wherein the semiconductor device includes:
a supporting body;
a semiconductor element being formed on one surface of the supporting body;
a lid body being placed over the semiconductor element; and
one or a plurality of terminals penetrating through the supporting body and being connected to the semiconductor element, and
the semiconductor element includes a semiconductor substrate and an interlayer insulating film disposed on the semiconductor substrate:
a plurality of circuits embedded in the semiconductor substrate;
a ring-shaped seal ring surrounding the plurality of circuits as viewed in plan view and embedded in the interlayer insulating film; and
a combination capacitance/resistance element including a capacitance element and a resistance element electrically connected to each other in series, the combination capacitance/resistance element arranged to electrically connect the seal ring and the semiconductor substrate.

* * * * *